US012573808B2

(12) United States Patent
Kimura et al.

(10) Patent No.: US 12,573,808 B2
(45) Date of Patent: Mar. 10, 2026

(54) METHOD OF MANUFACTURING A CAP FOR ACCOMMODATING A LASER DIODE, A CAP, AND A LIGHT SOURCE DEVICE

(71) Applicant: NICHIA CORPORATION, Anan (JP)

(72) Inventors: Yoshihiro Kimura, Yokohama (JP); Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 630 days.

(21) Appl. No.: 18/059,160

(22) Filed: Nov. 28, 2022

(65) Prior Publication Data

US 2023/0170665 A1 Jun. 1, 2023

(30) Foreign Application Priority Data

Nov. 30, 2021 (JP) ................................. 2021-193956

(51) Int. Cl.
*H01S 5/02257* (2021.01)
*H01S 5/00* (2006.01)
*H01S 5/028* (2006.01)

(52) U.S. Cl.
CPC ........ *H01S 5/02257* (2021.01); *H01S 5/0064* (2013.01); *H01S 5/028* (2013.01)

(58) Field of Classification Search
CPC .. H01S 5/02257; H01S 5/02218; H01S 5/028; H01S 5/02335; H01S 5/0201; H01S 5/02208; H10H 20/036; H10H 20/85; H10H 20/0362; H10H 20/021; H10H 20/01; H10H 71/00; H10K 59/80; H10K 59/8793; H10K 50/00; H01L 23/10; H01L 23/04; H01L 23/3185
See application file for complete search history.

(56) References Cited

U.S. PATENT DOCUMENTS

| | | | |
|---|---|---|---|
| 2006/0215280 A1 | 9/2006 | Hayashi et al. | |
| 2007/0046932 A1 | 3/2007 | Shimotsu | |
| 2019/0035700 A1 | 1/2019 | Murayama et al. | |
| 2020/0144785 A1 | 5/2020 | Neumann et al. | |
| 2021/0091532 A1* | 3/2021 | Miyata ................ | H01S 5/02216 |

(Continued)

FOREIGN PATENT DOCUMENTS

| | | |
|---|---|---|
| JP | 2006-267624 A | 10/2006 |
| JP | 2007-065318 A | 3/2007 |
| JP | 2020-520115 A | 7/2020 |

(Continued)

*Primary Examiner* — Tod T Van Roy
*Assistant Examiner* — Delma R Forde
(74) *Attorney, Agent, or Firm* — Foley & Lardner LLP

(57) ABSTRACT

A method includes providing a first plate for a front wall that defines a front surface of a recess to accommodate a laser diode, a second plate for a rear wall that defines a rear side of the recess, and a third plate for a main body that defines an upper side and lateral sides of the recess and is connected to the front wall and the rear wall. The third plate has through-holes arranged in a first direction and in a second directions orthogonal to the first direction. The plates are bonded together to produce a stacked body. The stacked body is cut along the first direction and the second direction to produce a plurality of caps from the stacked body. When cutting the stacked body along the first direction, a first incision is made along inner wall surfaces of through-holes adjacent along the first direction.

9 Claims, 23 Drawing Sheets

(56)          References Cited

U.S. PATENT DOCUMENTS

2021/0119409 A1    4/2021   Miyata

FOREIGN PATENT DOCUMENTS

| JP | 2021-052157 A | 4/2021 |
| JP | 2021-057459 A | 4/2021 |
| JP | 2021-068743 A | 4/2021 |
| WO | WO-2017/149573 A1 | 9/2017 |
| WO | WO-2021/211778 A1 | 10/2021 |

* cited by examiner

METHOD OF MANUFACTURING A CAP FOR ACCOMMODATING A LASER DIODE, A CAP, AND A LIGHT SOURCE DEVICE

CROSS-REFERENCE TO RELATED APPLICATION

This application claims priority to Japanese Patent Application No. 2021-193956 filed on Nov. 30, 2021, the entire contents of which are hereby incorporated by reference.

BACKGROUND

The present disclosure relates to a method of manufacturing a cap for accommodating a laser diode, a cap, and a light source device.

Applications for light source devices that include a laser diode as a light-emitting element are expanding into various fields. For example, display devices (so-called near-eye displays) having a display section at a position near the eyes of a user, e.g., head-mounted displays (HMD), are under development.

Japanese Patent Publication No. 2020-520115 describes a glass cover surrounding optoelectronics parts such as laser diodes and a method of manufacturing the same.

SUMMARY

The present disclosure provides a useful cap and a method of manufacturing the same, as well as a light source device.

In an illustrative embodiment, a method of manufacturing a cap according to the present disclosure produces a cap defining a recess to accommodate a laser diode. The method includes: providing a first plate for a front wall that defines a front side of the recess, the front wall being formed of a material that transmits laser light to be emitted from the laser diode; providing a second plate for a rear wall that defines a rear side of the recess, the rear wall being opposed to the front wall; providing a third plate for a main body that defines an upper side and lateral sides of the recess and is connected to the front wall and the rear wall, the third plate having a plurality of through-holes that are arranged in a two-dimensional array along a first direction and along a second direction, the first direction being contained in a plane that is orthogonal to a thickness direction, and the second direction being contained in the plane and orthogonal to the first direction; bonding the first plate and the third plate together and bonding the second plate and the third plate together to produce a stack in which the third plate is sandwiched by the first plate and the second plate; and a singulation step of cutting the stack along the first direction and along the second direction to produce a plurality of caps from the stack. In the singulation step, when the stack is cut along the first direction, a first incision is made along inner wall surfaces of through-holes adjacent along the first direction, the inner wall surfaces extending along the first direction and the thickness direction, and when the stack is cut along the second direction, a second incision is made at a position spaced from through-holes adjacent along the second direction.

In an illustrative embodiment, a cap according to the present disclosure defines a recess to accommodate a laser diode, the cap including: a front wall that defines a front side of the recess, the front wall being formed of a material that transmits laser light to be emitted from the laser diode; a rear wall that defines a rear side of the recess, the rear wall being opposed to the front wall; a main body that defines an upper side and lateral sides of the recess and is connected to the front wall and the rear wall; and an antireflection coating provided on a surface of the front wall. Lower end surfaces, respectively, of the front wall, the rear wall, and the main body define a bonding surface of the cap. In a plan view as seen from a normal direction of the front wall, a perimeter of the antireflection coating is spaced from the lower end surface of the front wall.

In an illustrative embodiment, a light source device according to the present disclosure includes: a laser diode; a substrate directly or indirectly supporting the laser diode; and the above cap. A bonding surface of the cap is bonded to the substrate, and the cap covers the laser diode.

Certain embodiments of the present disclosure provide a useful cap and a method of manufacturing the same, as well as a light source device.

DETAILED DESCRIPTION

Configuration of Light Source Device

Figure 1A:
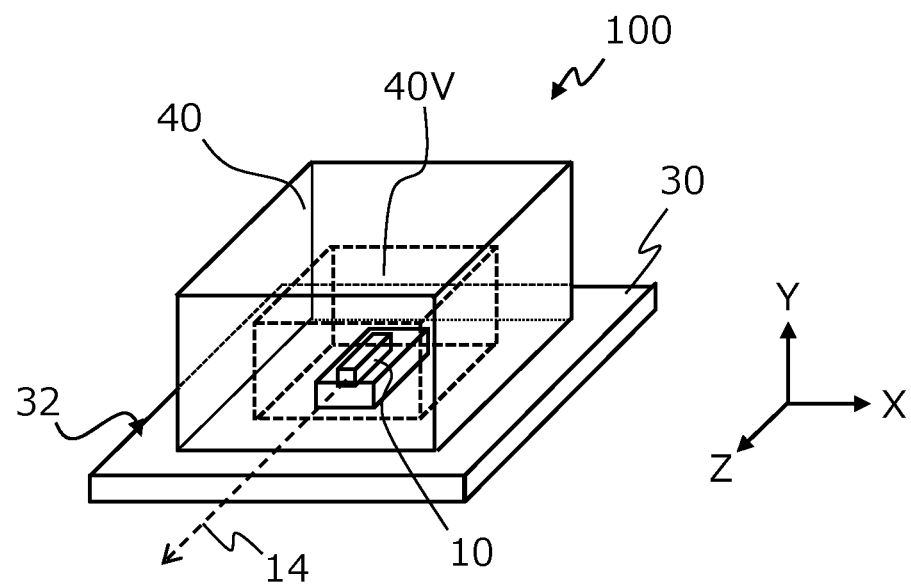
FIG. 1A is a perspective view schematically showing an example configuration of a light source device according to the present embodiment.
Figure 1B:
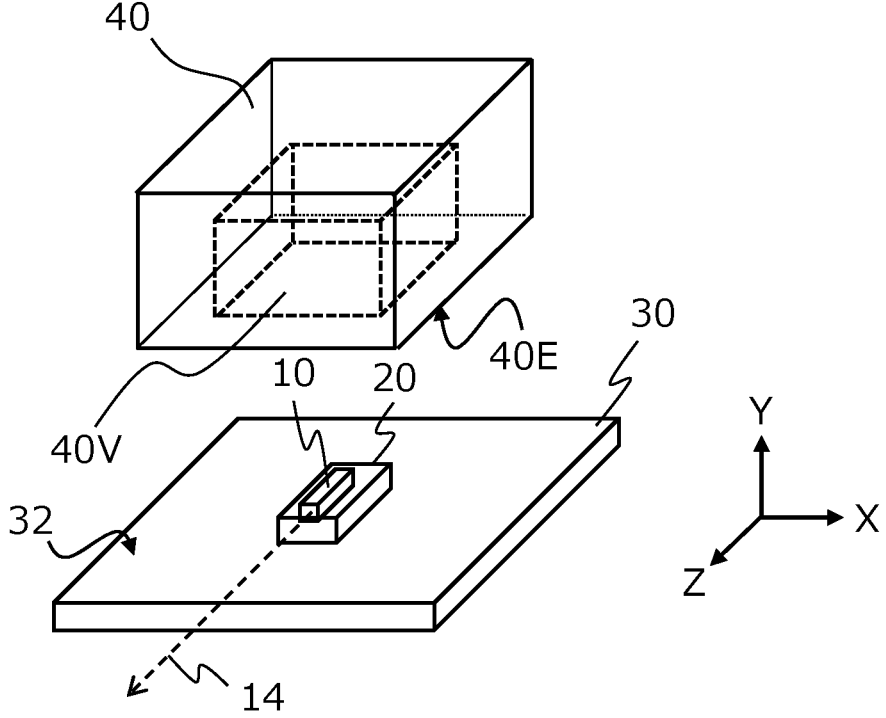
FIG. 1B is a perspective view schematically showing an example configuration of a light source device according to the present embodiment during manufacturing.
Figure 2:
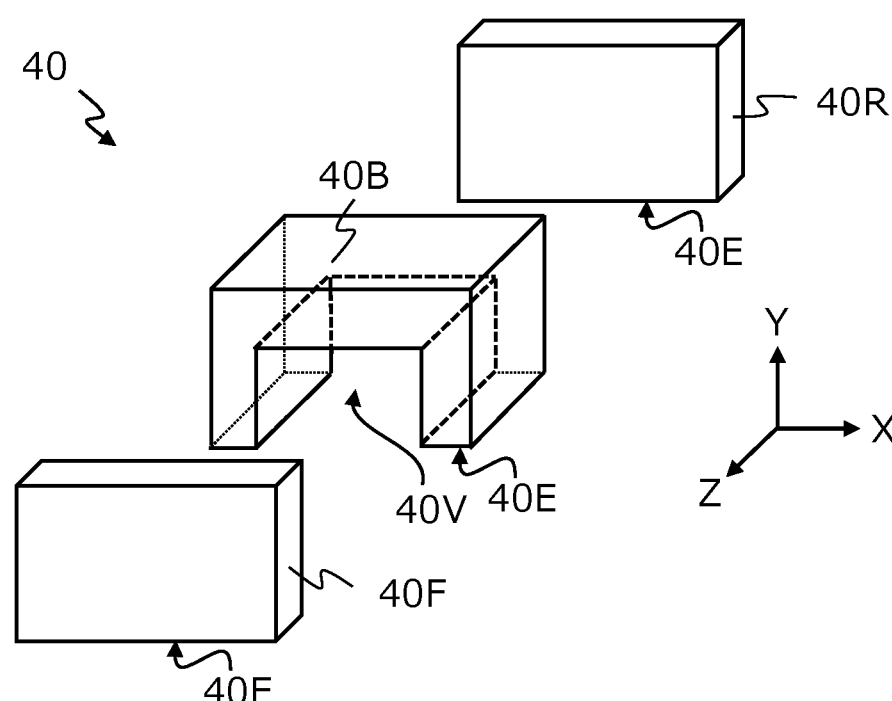
FIG. 2 is an exploded perspective view of a cap according to the present embodiment.

With reference to FIG. 1A, FIG. 1B, and FIG. 2, a schematic configuration of a light source device according to the present embodiment will be described. FIG. 1A is a perspective view schematically showing an example configuration of a light source device 100 according to the present embodiment. FIG. 1B is a perspective view schematically showing an example configuration of the light source device 100 during manufacturing. FIG. 2 is an exploded perspective view of a cap 40 included in the light source device 100. In the figures, the X axis, the Y axis, and the Z axis, which are orthogonal to one another, are shown for reference's sake.

The illustrated light source device 100 includes a laser diode 10, a substrate 30 directly or indirectly supporting the laser diode 10, and a cap 40 that is fixed to the substrate 30 and covers the laser diode 10.

The cap 40 defines a recess (cavity) 40V for accommodating the laser diode 10. Before the cap 40 is fixed to the substrate 30, the recess 40V opens downward, as shown in FIG. 1B. The cap may be referred to as a "lid." As shown in FIG. 2, the cap 40 according to the present embodiment includes a front wall 40F defining a front side of the recess 40V, a rear wall 40R defining a rear side of the recess 40V, and a main body 40B defining an upper side and lateral sides of the recess 40V. The front wall 40F is formed of a material that transmits laser light to allow the transmitted laser light to be emitted from the laser diode 10. The rear wall 40R faces the front wall 40F via the recess 40V. The main body 40B is connected to the front wall 40F and the rear wall 40R.

Respective lower end surfaces 40E of the front wall 40F, the rear wall 40R, and the main body 40B, as a whole, define a lower end surface 40E of the cap 40, and hence a bonding surface for the substrate 30. The lower end surface 40E of the cap 40 is located around the open face of the recess 40V. The lower end surface 40E of the cap 40 is bonded to the principal surface 32 of the substrate 30 via a bonding member, allowing the recess 40V to be sealed airtight from the outside of the cap 40. Preferably, the lower end surfaces 40E of the front wall 40F, the rear wall 40R, and the main body 40B are substantially coplanar. As will be described later, the lower end surface 40E of each of the front wall 40F, the rear wall 40R, and the main body 40B is formed by a cutting process using a dicing blade, and therefore may include minute (e.g. 50 μm or less) surface roughness or steps. Such surface roughness or steps will not affect bonding so long as they are smaller than the thickness of the bonding member that is provided between the lower end surface 40E and the principal surface 32 of the substrate 30.

The cap 40 includes an antireflection coating provided on a surface at the side of the front wall 40F facing the laser diode 10 (the inner side, i.e., the rear side). In a plan view as seen from the normal direction of the front wall 40F, the perimeter of this antireflection coating is spaced from the lower end surface 40E of the front wall 40F. The effect obtained from this will be described later. Note that an antireflection coating may also be formed on the outer surface of the front wall 40F (the front side). In a plan view as seen from the normal direction of the front wall 40F, the perimeter of the antireflection coating provided on the outer surface of the front wall 40F does not need to be spaced from the lower end surface 40E of the front wall 40F. In the present embodiment, the inner and outer surfaces of the front wall 40F are flat, and may exemplarily be smooth.

In the example shown in the drawings, the recess 40V has a rectangular-parallelepiped shape. However, the recess 40V may have shapes other than a rectangular-parallelepiped. The configuration of the cap 40 and a method of producing the same will be described below in detail.

Examples of the laser diode 10 include a laser diode that radiates blue light, a laser diode that radiates green light, and a laser diode that radiates red light. A laser diode that radiates other light may be employed.

In the present specification, blue light refers to light having an emission peak wavelength in a range of 420 nm to 494 nm. Green light refers to light having an emission peak wavelength in a range of 495 nm to 570 nm. Red light refers to light having an emission peak wavelength in a range of 605 nm to 750 nm.

Examples of laser diodes that emit blue light or laser diodes that emit green light include laser diodes containing a nitride semiconductor. Examples of nitride semiconductors include GaN, InGaN, and AlGaN. Examples of laser diodes that emit red light include laser diodes containing an InAlGaP-based or GaInP-based semiconductor, a GaAs-based or AlGaAs-based semiconductor, etc.

Laser light 14 radiated from the laser diode 10 is divergent, and creates a far field pattern (hereinafter abbreviated as "FFP") of an elliptical shape at a surface that is parallel to an emission end surface through which the laser light 14 is emitted. The FFP is determined by an optical intensity distribution of the laser light 14 at a position apart from the emission end surface. In this optical intensity distribution, a portion having an intensity that is $1/e^2$ or greater with respect to the peak intensity value may be referred to as a "beam cross section."

While an edge-emission type laser diode having an end surface through which the laser light 14 is emitted is employed for the laser diode 10 in the present embodiment, a surface emitting type laser diode (VCSEL) may be employed for the laser diode 10. For simplicity, a center axis of the laser light 14 is indicated with a broken line in the drawing. The actual laser light 14, as described above, diverges and spreads out after being emitted through the end surface of the laser diode 10. Therefore, the laser light 14 may be collimated or converged by an optical system including a lens or lenses. Such an optical system may be provided outside of the light source device 100. At least a portion of the optical system including lenses for collimation or convergence may be provided on the cap 40, or disposed within the recess 40V of the cap 40.

The center axis of the laser light 14 extends in a direction along the principal surface 32 of the substrate 30 (i.e., the Z axis direction). Laser light 14 emitted from the light source device 100 to the outside may be reflected in a direction e.g. perpendicular to the principal surface 32 of the substrate 30 by a mirror disposed outside the light source device 100.

In the example shown in the drawings, the laser diode 10 is mounted on the principal surface 32 of the substrate 30 in a state of being secured on a submount 20. Without utilizing the submount 20, the laser diode 10 may be directly bonded to the principal surface 32 of the substrate 30 instead. In these drawings, wiring for connecting the laser diode 10 to an external circuit is omitted from illustration.

A ceramic may be used for a main material of the substrate 30. For the substrate 30, a material other than a ceramic may be used, and a metal, or a composite material of a ceramic and a metal may be used. Examples of a main material of the substrate 30 include ceramics such as aluminum nitride, silicon nitride, aluminum oxide, and silicon carbide; metals such as copper, aluminum, iron; and composites such as copper molybdenum, copper-diamond composite materials, and copper tungsten.

A plurality of metal layers may be disposed on each of an upper surface (principal surface 32) and a lower surface of the substrate 30. The plurality of metal layers may include metal layers for electric interconnection or hermetic sealing purposes. A metal may be disposed to extend inside the substrate 30, which allows metal layers on the upper surface to be electrically connected to metal layers on the lower surface. On the lower surface of the substrate 30, other metal layers for electrical interconnections that are not electrically connected to the metal layers on the upper surface may be disposed. Examples of the substrate 30 include a multilayered ceramic substrate that includes interconnects on the inside and/or the outside.

The submount 20 has a lower surface, an upper surface, and lateral surfaces, and may exemplarily have a rectangular-parallelepiped shape. The submount 20 may be formed of a silicon nitride, an aluminum nitride, or a silicon carbide, for example. Metal layers for connecting the laser diode 10 to interconnects on the substrate 30 may be disposed on the upper surface of the submount 20.

The cap 40 is secured to the substrate 30 to cover the laser diode 10 supported by the substrate 30. In the example in the drawings, the lower end surface 40E of the cap 40 is bonded to the principal surface 32 of the substrate 30. Such bonding may be achieved via a layer of metal material, inorganic material, or organic material. Thus, the laser diode 10 may be sealed airtight. The light source device 100 depicted in FIG. 1A may be referred to as a "semiconductor laser package." While the example shown in the drawings illustrates the light source device 100 as including a single laser diode 10, other configurations may also be employed in the present embodiment. A plurality of laser diodes 10 may be arranged inside a single recess 40V of the cap 40. The plurality of laser diodes 10 may, for example, be disposed parallel to one another, so as to emit the laser light 14 in an identical direction.

Figure 3:
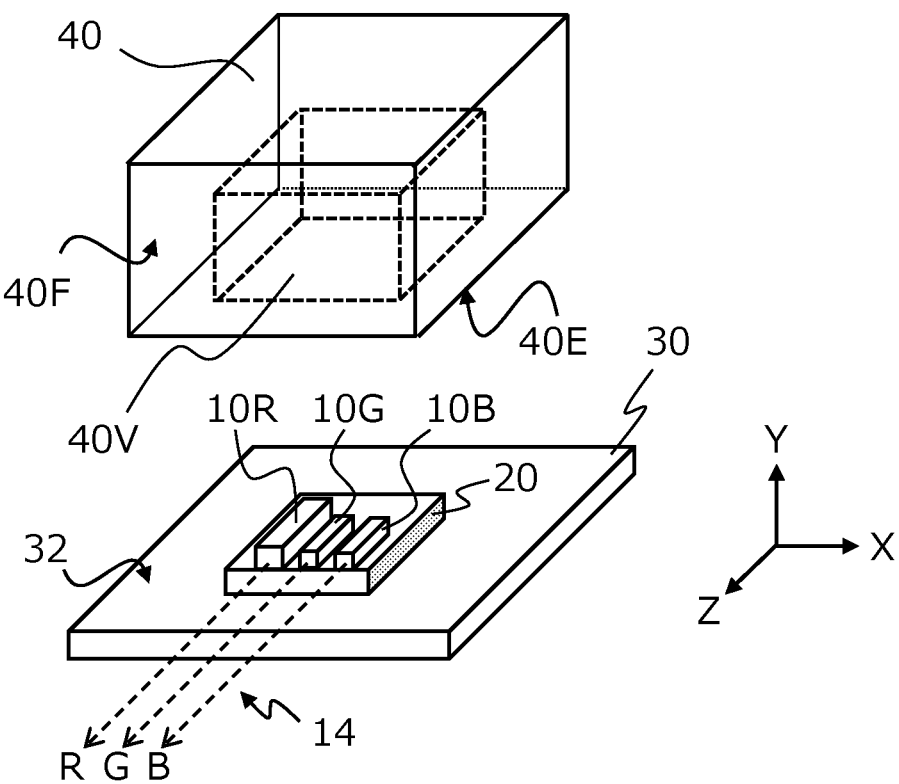
FIG. 3 is a perspective view schematically showing another example of a light source device according to the present embodiment.

FIG. 3 is a perspective view schematically showing another example of a light source device according to the present embodiment. In this example, the substrate 30 includes three laser diodes 10R, 10G and 10B that are arranged on a single submount 20. The laser diodes 10R, 10G and 10B respectively radiate laser light 14 of red, green, and blue colors. The laser diodes 10R, 10G and 10B may be accommodated inside the single cap 40 and sealed airtight. Two or more submounts 20 may be employed, and the submounts 20 may be provided separately for respective ones of the laser diodes 10R, 10G and 10B.

The laser light 14 radiated from each of the laser diodes 10R, 10G and 10B may be combined into a coaxial beam by a beam combiner, or used for scanning in different directions by different micromirrors. The laser diodes 10R, 10G and 10B may radiate the laser light 14 with respectively different timings, or all simultaneously. Emission of the laser light 14 is controlled by a driving circuit.

During operation of the light source device 100, the laser light 14 emitted from the laser diode 10 is transmitted through the frontal wall 40F of the cap 40. At this time, the laser light 14 is transmitted through the antireflection coating provided on the inside of the front wall 40F, or antireflection coatings provided on both the inside and the outside of the front wall 40F. Portions of the cap 40 other than the front wall 40F do not need to be light-transmissive. Even portions of the front wall 40F other than the portion to transmit the laser light 14 does not need to be light-transmissive. On the surface of any portion of the cap 40 that does not need to be light-transmissive, a light absorbing film may be formed so as not to allow stray light to occur.

Configuration of Cap

Figure 4A:
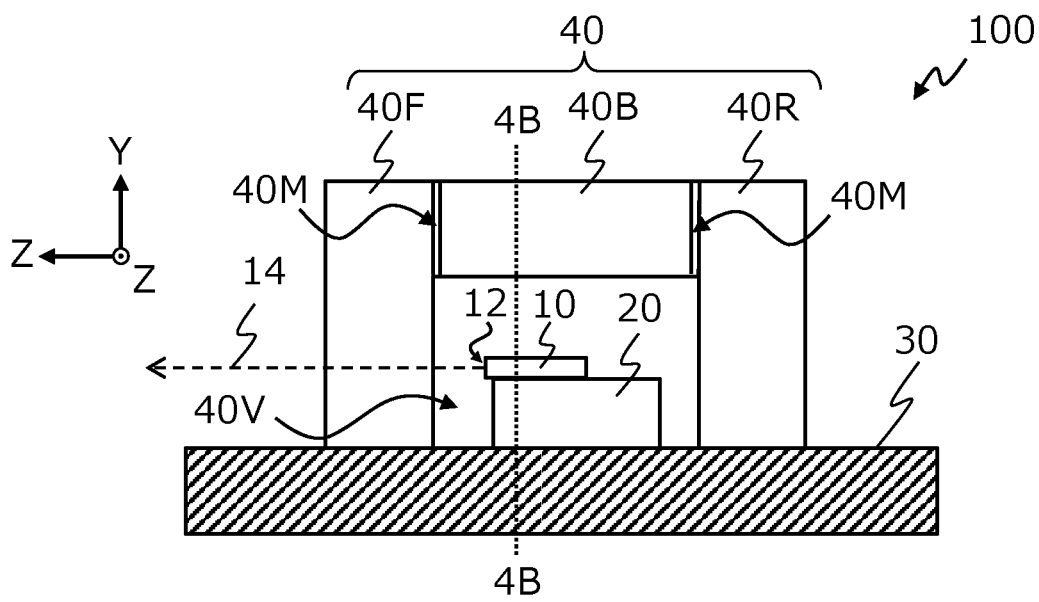
FIG. 4A is a cross-sectional view of a light source device according to the present embodiment as taken parallel to the YZ plane.
Figure 4B:
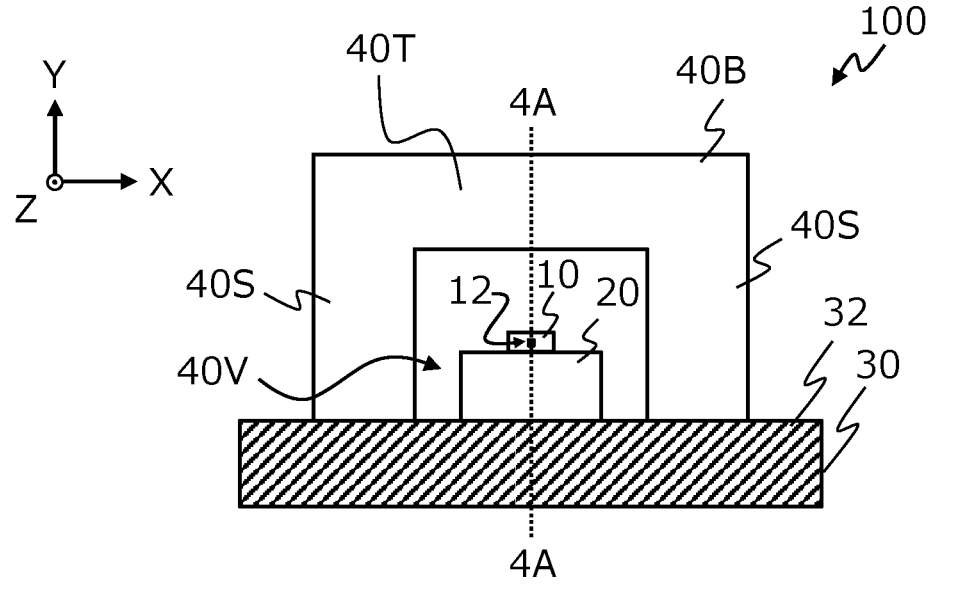
FIG. 4B is a cross-sectional view of a light source device according to the present embodiment as taken parallel to the XY plane.

Hereinafter, with reference to FIG. 4A and FIG. 4B, an example configuration of the cap 40 according to the present embodiment will be described in detail. FIG. 4A is a cross-sectional view schematically showing a cross section parallel to the YZ plane, the cross section including the center axis of the laser light 14. FIG. 4B is a cross-sectional view taken along line 4B-4B in FIG. 4A, showing a cross section that is parallel to the XY plane. FIG. 4A corresponds to a cross-sectional view along line 4A-4A in FIG. 4B.

As illustrated shown in FIG. 2, the cap 40 shown in FIG. 4A and FIG. 4B has a structure in which the front wall 40F and the rear wall 40R are bonded to two opposite sides of the main body 40B. As will be described later, the front wall 40F may be formed of a first plate (first sheet) such as glass, whereas the rear wall 40R may be formed of a second plate (second sheet) such as glass or silicon. The main body 40B may be formed of a third plate such as glass or silicon. The rear wall 40R and the main body 40B do not need to be formed of a light-transmissive material.

Figure 5:
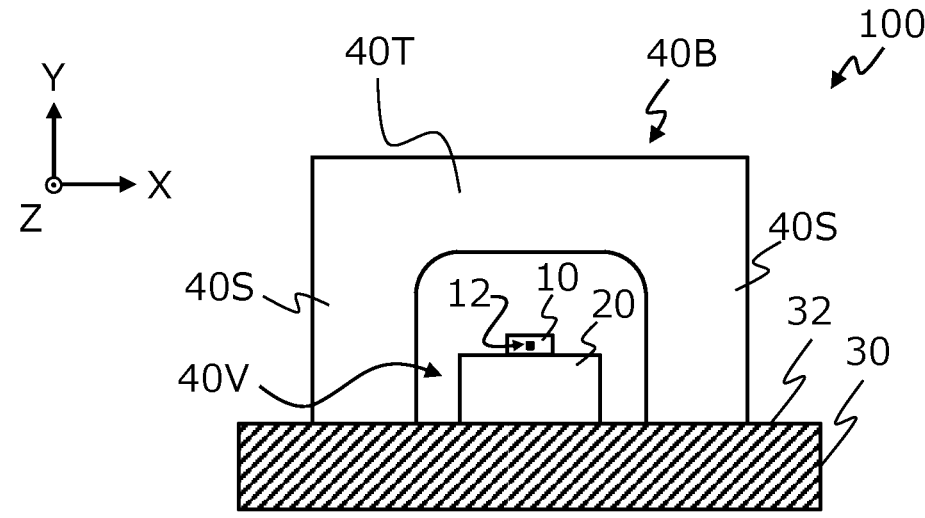
FIG. 5 is a cross-sectional view of a modified example of a light source device according to the present embodiment as taken parallel to the XY plane.

The front wall 40F of the cap 40 is disposed so as to intersect with a path of the laser light 14 on the substrate 30. The rear wall 40R is disposed in parallel to the front wall 40F. As shown in FIG. 4B, the main body 40B has a shape of the alphabetical letter "C" in a cross-sectional view, and is connected to the front wall 40F and the rear wall 40R together. As shown in FIG. 4B, the main body 40B includes a pair of lateral wall portions 40S located at lateral sides of the laser diode 10, and a cover portion 40T that is located above the laser diode 10 and connects the pair of lateral wall portions 40S together. Thus, the main body 40B has a shape defining the upper side and the lateral sides of the recess 40V. Note that the cap 40 may have a configuration other than the example illustrated in FIG. 4A and FIG. 4B. For example, as shown in FIG. 5, the main body 40B of the cap 40 may have a shape in which an inner wall surface includes a curved surface. Thus, the recess 40V of the cap 40 may have a shape other than a rectangular-parallelepiped.

In the present embodiment, the front wall 40F and the rear wall 40R are formed of an alkaline glass, whereas the main body 40B is formed of a non-alkaline glass. Conversely, the main body 40B may be formed of an alkaline glass, while the front wall 40F and the rear wall 40R may be formed of an non-alkaline glass. Alternatively, all of the front wall 40F, the main body 40B, and the rear wall 40R may be formed of an alkaline glass.

An "alkaline glass" as used herein is a silicate compound glass that contains ions of alkali metal elements such as Na+, Ka+, and/or Li+. A silicate compound glass containing an alkaline oxide at a concentration of 0.1 mass % or less is referred to as a "non-alkaline glass." Examples of silicate compound glasses include silicate glass, borosilicate glass, and quartz glass.

In the present embodiment, the front wall 40F is anodically bonded to an electrically conductive layer 40M that is disposed on the surface of the main body 40B (FIG. 4A). Similarly, the rear wall 40R is anodically bonded to another electrically conductive layer 40M that is disposed on the surface of the main body 40B. Each electrically conductive layer 40M may be composed of different kinds of metals being stacked upon one another. For example, the electrically conductive layer 40M may have a multilayer structure in which a titanium layer as an underlying layer is deposited on the surface of the main body 40B and an aluminum layer is deposited on the titanium layer. Materials other than those in the example described above may be employed as a material of the electrically conductive layers 40M.

In the present embodiment, anodic bonding can be carried out by applying a potential (e.g. –500 volts to –1 kilovolt) lower than the potential of the main body 40B to the front wall 40F or the rear wall 40R, followed by heating at a temperature in a range of about 300° C. to 400° C. For anodic bonding, any appropriate technique may be employed, and various known techniques may be employed. As a result of the anodic bonding, the concentration of the alkali metal element in the front wall 40F is locally decreased in a region in contact with the electrically conductive layer 40M. Similarly, the concentration of the alkali metal element in the rear wall 40R is locally decreased in a region in contact with the electrically conductive layer 40M. Note that an additional electrically conductive layer 40M may be provided on at least one of the front wall 40F and the rear wall 40R. In that case, no electrically conductive layer 40M needs to be provided on the surface of the main body 40B that is bonded to the front wall 40F and/or the rear wall 40R having this additional electrically conductive layer 40M. The front wall 40F and the rear wall 40R may be bonded to the main body 40B in any order. After the front wall 40F and the main body 40B are bonded together, the rear wall 40R may be bonded to the main body 40B. Conversely, after the rear wall 40R and the main body 40B are bonded together, the front wall 40F may be bonded to the main body 40B. Alternatively, the front wall 40F and the rear wall 40R may be simultaneously bonded to the main body 40B.

Although the present embodiment illustrates that anodic bonding is used to bond the front wall 40F and the rear wall 40R to the main body 40B, other methods of bonding may be employed to bond each of the front wall 40F and the rear wall 40R to the main body 40B. Example methods of bonding include direct bonding methods, such as atomic diffusion bonding (ADB), surface activated bonding (SAB), and hydroxyl bonding. The main body 40B may be formed of a non-glass material, e.g., a semiconductor (monocrystalline silicon, polycrystalline silicon, silicon carbide, etc.).

The main body 40B does not need to be light-transmissive. In the case where substantially the entire cap 40 (including the main body 40B) is formed of a glass, the cap 40 may be referred to as a "glass cap" or a "glass lid." While the example in FIG. 4A illustrates that the electrically conductive layers 40M are disposed only at the bonding surface, another electrically conductive layer 40M may also be formed on a surface (inner surface) of the main body 40B that defines the recess 40V. Specific examples of the method of producing the cap 40 will be described later.

According to the present embodiment, the front wall 40F of the cap 40 is formed of a glass plate or a glass sheet, so that the front wall 40F can easily have a smooth surface. Moreover, it is also possible to form an antireflection coating on a surface of the front wall 40F, prior to anodic bonding. This allows an antireflection coating to be formed on the inner surface of the cap 40 with a high production yield, even if the cap 40 is reduced in size. An antireflection coating may also be formed on the rear wall 40R in a similar manner to the front wall 40F.

Figure 6:
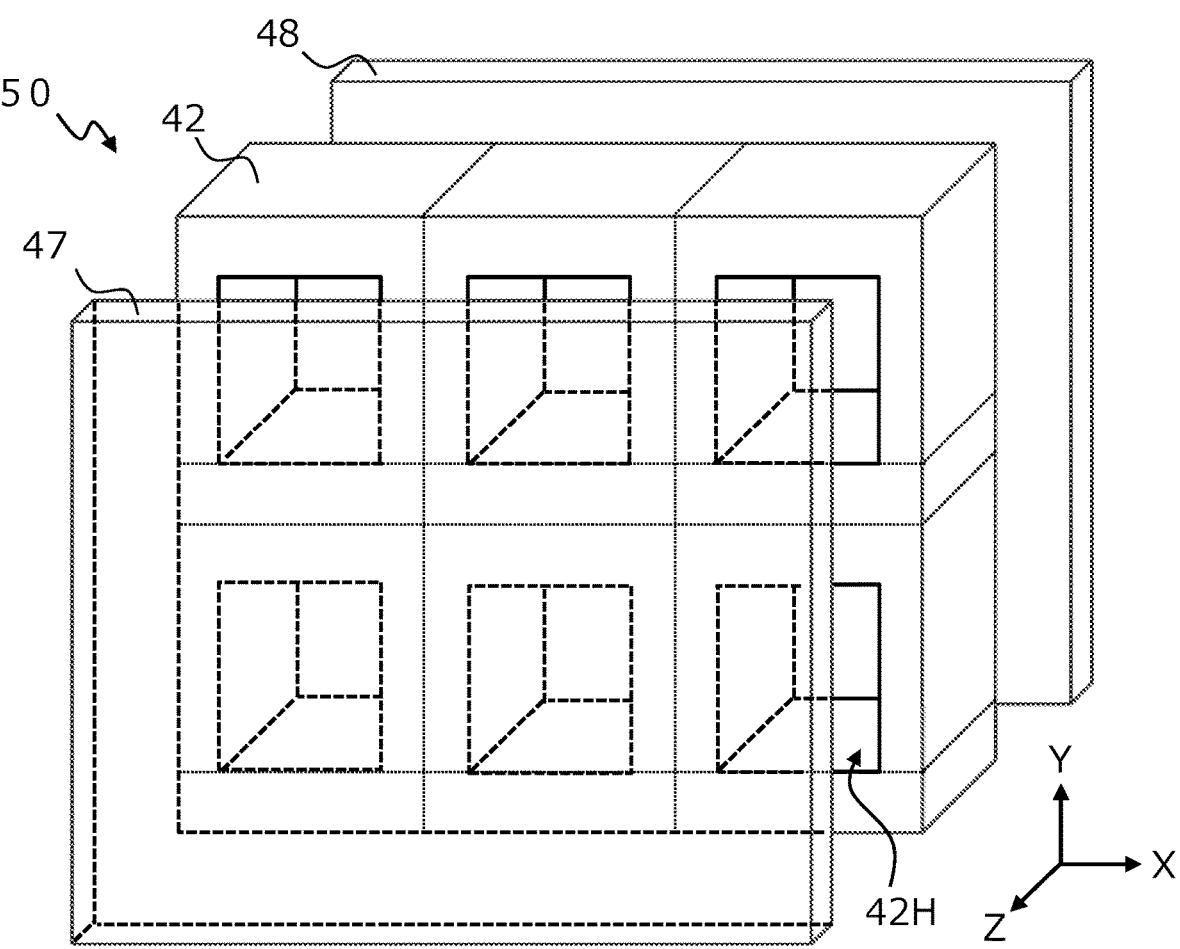
FIG. 6 is an exploded perspective view schematically showing an example of a panel that includes main bodies of six caps to be singulated therefrom.
Figure 7:
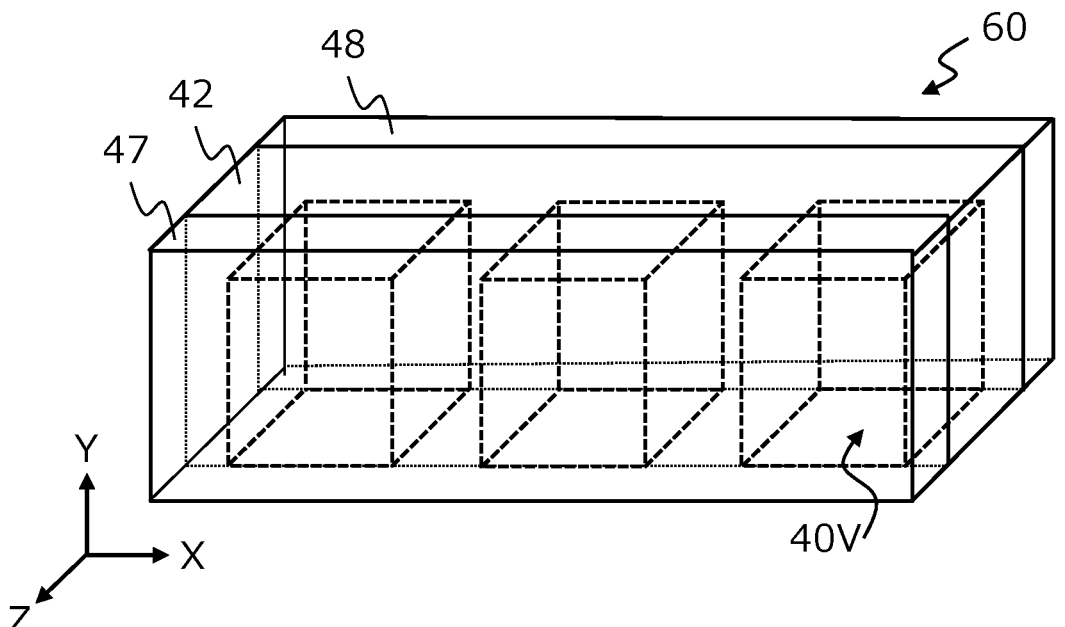
FIG. 7 is a perspective view of a structure to be obtained by cutting a third plate, the structure including main bodies of three caps.

FIG. 6 is an exploded perspective view schematically showing an example of a panel 50 from which a plurality of main bodies 40B (see FIG. 4) will be formed. The third plate 42 has six through-holes 42H that are arranged in two rows and three columns. The through-holes 42H are closed with two plates, i.e., a first plate 47 and a second plate 48, on two opposite sides of the third plate 42, so that a single panel (stacked body) 50 can be obtained. The first plate 47 and the second plate 48 may each be a thin glass sheet with a thickness of about 1 mm or less, for example. The panel 50 is divided along the lateral direction in FIG. 6 to provide a structure body 60 shown in FIG. 7. The structure body 60 includes three pieces corresponding to the main bodies of three caps to finally result. Each of the three recess 40V included in the structure body 60 opens downward. By dividing the structure body 60 along the vertical direction in FIG. 7, three caps can be singulated therefrom. When thus singulating the caps from the panel 50, the order of performing the cuts along the lateral and vertical directions in the figure may be discretionarily selected. The vertical cuts may be performed before the lateral cut.

Method of Manufacturing a Cap

Hereinafter, one embodiment of a method of producing a multitude of caps 40 will be described in more detail.

Figure 8:
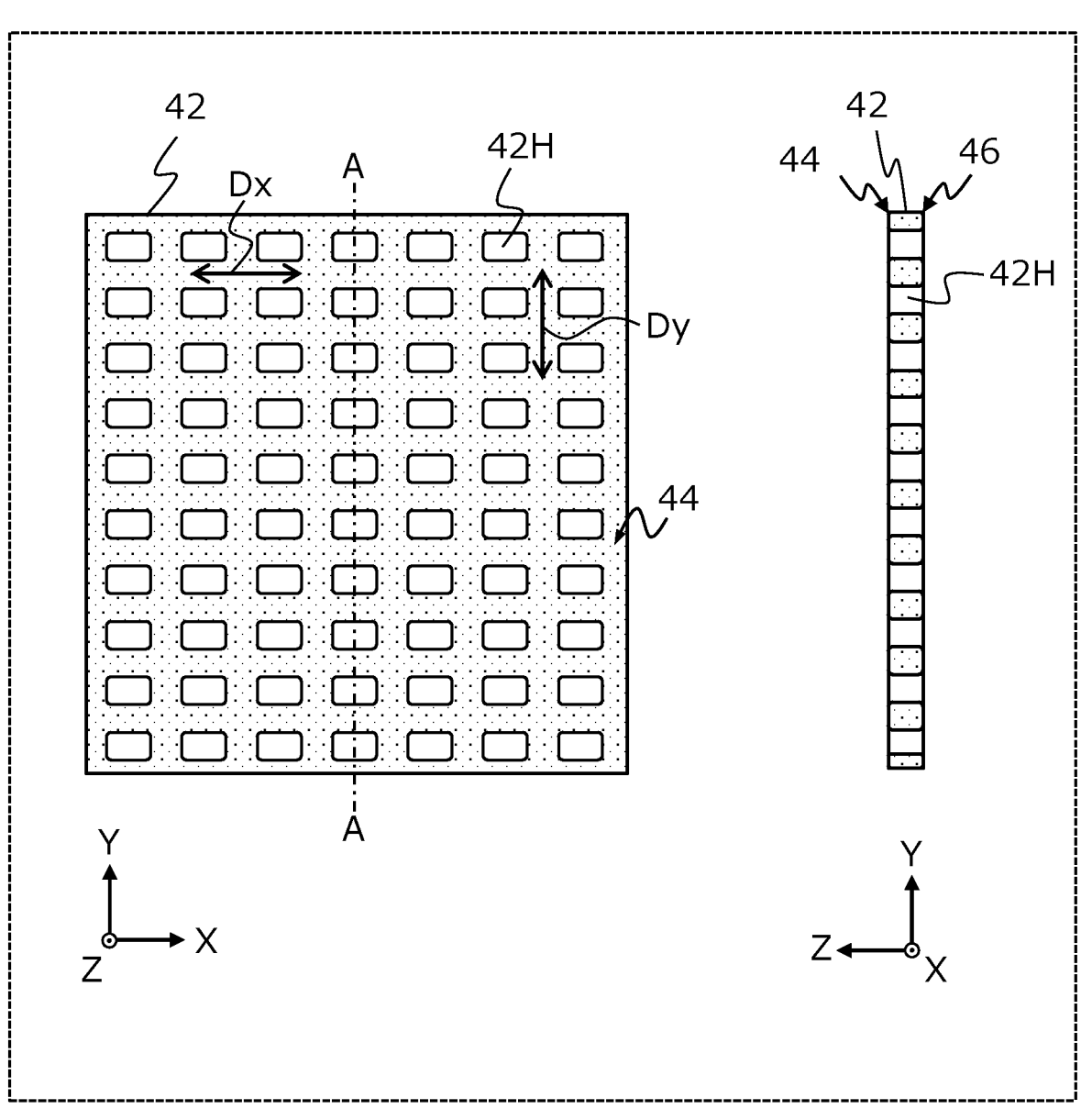
FIG. 8 is a diagram schematically showing an upper surface (on the left) and a cross section along line A-A (on the right) of a third plate.

First, see FIG. 8. FIG. 8 is a diagram schematically showing an upper surface (on the left) and a cross section taken along line A-A (on the right) of the third plate 42. First, the third plate 42 for the main body 40B, which defines the upper side and lateral sides of the recess 40V and is connected to the front wall 40F and the rear wall 40R, is provided. The third plate 42 is a flat plate having a first surface (upper surface) 44 and a second surface (lower surface) 46 opposite to the first surface 44. The third plate 42 has a plurality of through-holes 42H that are arranged in a two-dimensional array along a first direction (Dx direction) and along a second direction (Dy direction), the first direction (Dx direction) included in a plane (the XY plane) that is orthogonal to the thickness direction, and the second direction (Dy direction) included in the plane (the XY plane) and orthogonal to the first direction (Dx direction). The through-holes 42H extend from the first surface 44 to the second surface 46. In this example, the first direction Dx is parallel to the X axis, whereas the second direction Dy is parallel to the Y axis. Each through-hole 42H extends along the Z axis direction. Because each through-hole 42H will eventually become the corresponding recess (cavity) 40V in a cap 40, the third plate may be referred to as a "cavity plate."

The through-holes 42H can be formed by providing a glass or semiconductor substrate (thickness: e.g., 0.5 to 5 mm), and processing this substrate (etching or drilling), for example. The processing may be performed by, for example, forming a mask pattern and then performing sandblasting or etching. The through-holes 42H may alternatively be formed by machining, laser processing, or the like. The sizes of the through-holes 42H along the X direction, the Y direction, and the Z direction may be, respectively, 0.5 to 5 mm, 0.2 to 5 mm, and 0.5 to 5 mm, for example.

Figure 9:
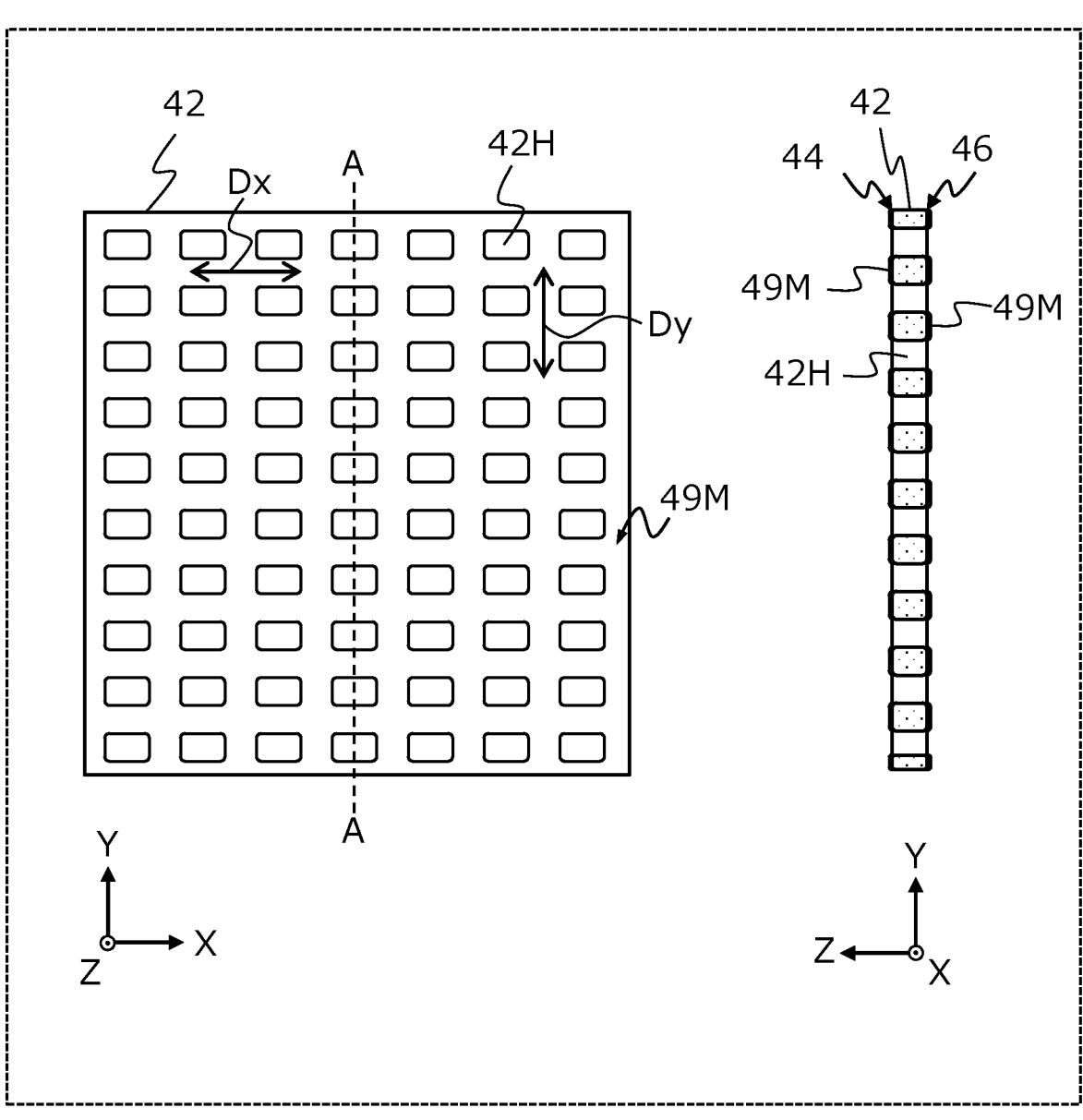
FIG. 9 is a diagram schematically showing an upper surface (on the left) and a cross section along line A-A (on the right) of a third plate on which metal layers are formed.
Figure 10:
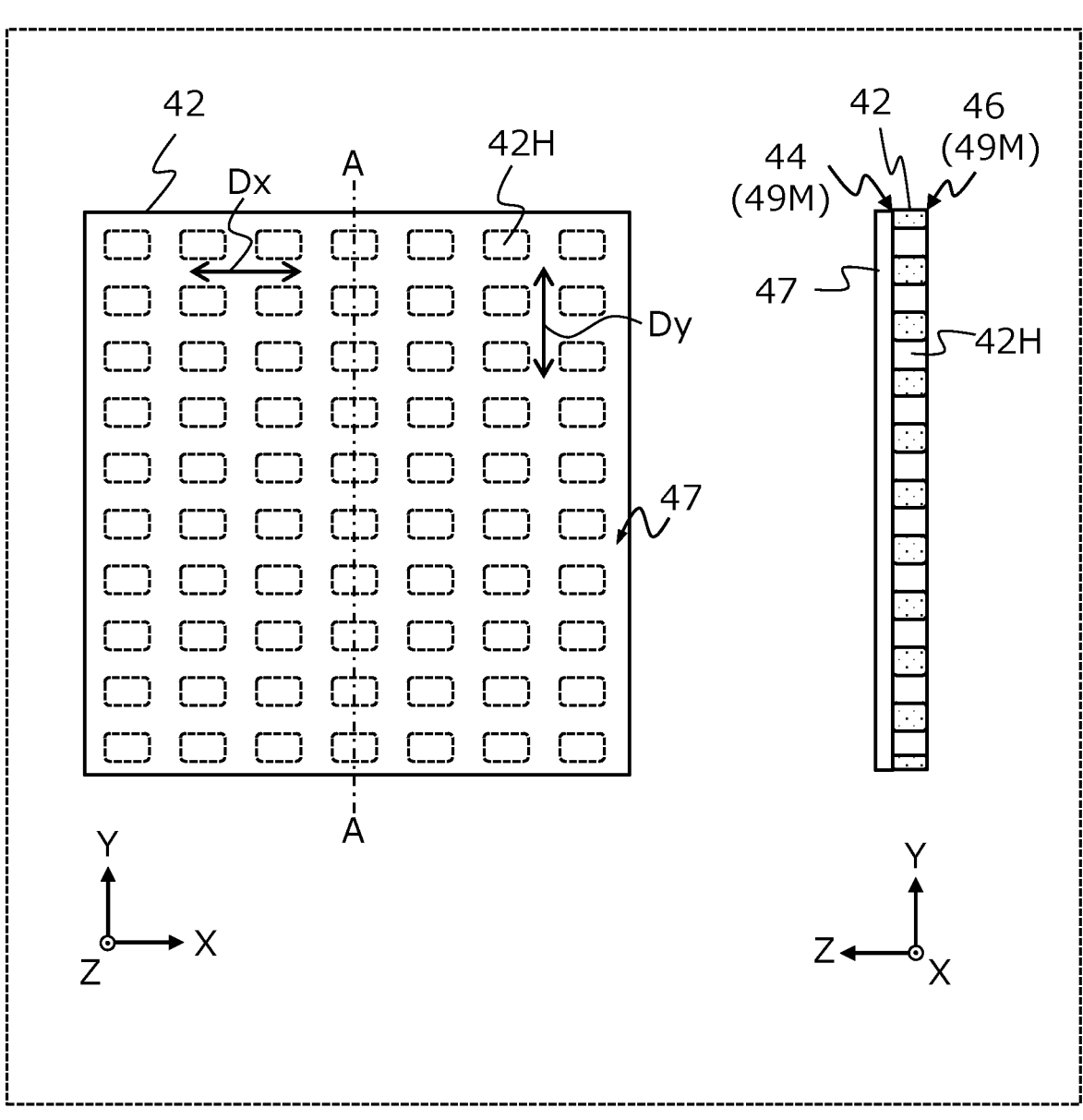
FIG. 10 is a diagram schematically showing an upper surface (on the left) and a cross section along line A-A (on the right) of a third plate to which a first plate is bonded.

Next, FIG. 9 will be described. FIG. 9 shows a metal layer 49M that has been deposited on the first surface 44 and the second surface 46 of the third plate 42, in which the plurality of through-holes 42H are defined. Thereafter, as shown in FIG. 10, a first plate (thickness: e.g., 0.2 to 1.0 mm) 47 is bonded to the first surface 44 side of the third plate 42, on which the metal layer 49M is formed. Typical examples of the metal layer 49M may include a layer of aluminum (thickness: e.g., 50 to 1000 nm). The metal layer 49M may be formed of a metal other than aluminum, e.g., titanium. The bonding may be performed using anodic bonding as described above, or by another method of bonding. The inner surface of the first plate 47 corresponds to the inner surface of the front wall 40F of the cap 40 shown in FIG. 1B.

Figure 11A:
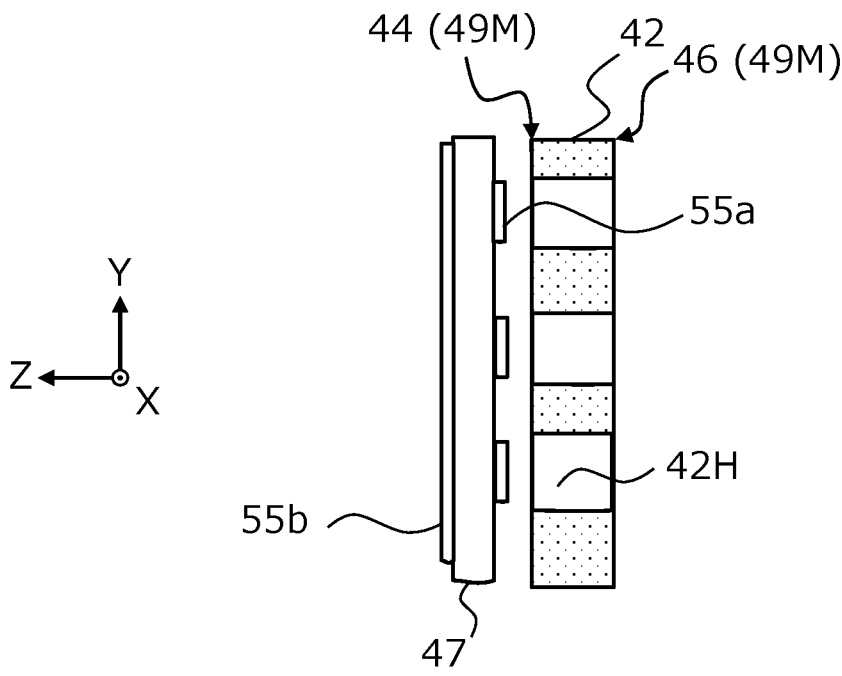
FIG. 11A is a cross-sectional view schematically showing bonding of the first plate, on which antireflection coatings are formed, to the third plate.
Figure 11B:
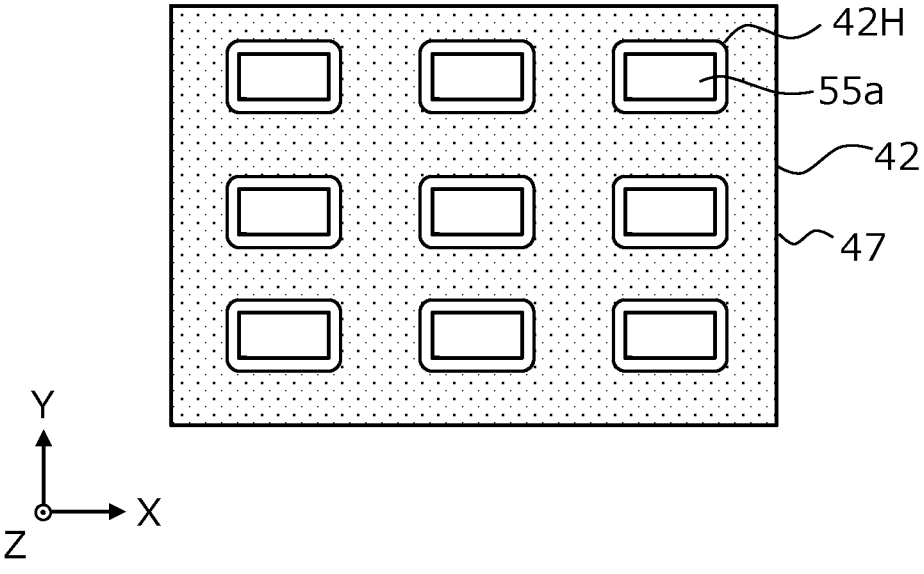
FIG. 11B is a plan view schematically showing an antireflection coating pattern.

FIG. 11A is a cross-sectional view schematically showing bonding of the first plate 47 (on which antireflection coatings 55a and 55b are formed) to the first surface 44 of the third plate 42. FIG. 11B is a plan view schematically showing an antireflection coating pattern. For example, in the case where the first plate 47 is bonded to the third plate 42 by anodic bonding, preferably the antireflection coating 55b is formed after anodic bonding, so that the presence of the antireflection coating 55b will not hinder the anodic bonding process. In the present embodiment, in order to form an antireflection coating pattern on the inner surface of the front wall 40F of the cap 40, antireflection coatings 55a are provided on the surface of the first plate 47 (i.e., the portion to become the inner surface of the front wall 40F of the cap 40), prior to anodic bonding. Stated otherwise, the step of providing the first plate 47 includes a step of forming a plurality of antireflection coatings 55a at positions respectively facing the plurality of through-holes 42H of the third plate 42, on the surface of the first plate 47.

As can be seen from FIG. 11B, in a plan view as seen from the normal direction of the first plate 47, the perimeter of each antireflection coating 55a is at a position shifted inward from the inner wall surface of the corresponding through-hole 42H. In the example shown in the drawings, on the front surface of the first plate 47, the antireflection coating 55b with a uniform thickness is continuously formed. The timing of forming the antireflection coating 55b on the front side of the first plate 47 may be after completing all of the anodic bonding. Note that similar antireflection coatings 55a and/or an antireflection coating 55b may also be formed on the second plate 48, similarly to on the first plate 47. Note that a light absorbing film(s) may be formed on the second plate 48, instead of or in addition to antireflection coatings.

In the present embodiment, when performing cuts with a dicing blade in a singulation step described below, incisions are to be made in such a manner that the antireflection coatings 55a will not be cut by the incisions.

Because anodic bonding is to be performed, no antireflection coatings 55a exist in the region in which the first plate 47 comes in contact with the third plate 42 at the rear side of the first plate 47 (i.e., the portion to become the inner surface of the front wall 40F of the cap 40); rather, antireflection coatings 55a are formed in regions other than the region in which the first plate 47 comes in contact with the third plate 42. The shape and size of the antireflection coatings 55a are determined by giving consideration to how much misalignment may occur when bonding the first plate 47 (having a pattern of antireflection coatings 55a formed thereon) with the third plate 42. It suffices that the antireflection coatings 55a cover only a region of the front wall 40F that is struck by laser light being emitted from the laser diode 10. Therefore, the dimensions along the X direction and the Y direction of the antireflection coatings 55a may respectively be smaller than the dimensions along the X direction and the Y direction of each through-hole 42H.

Figure 12:
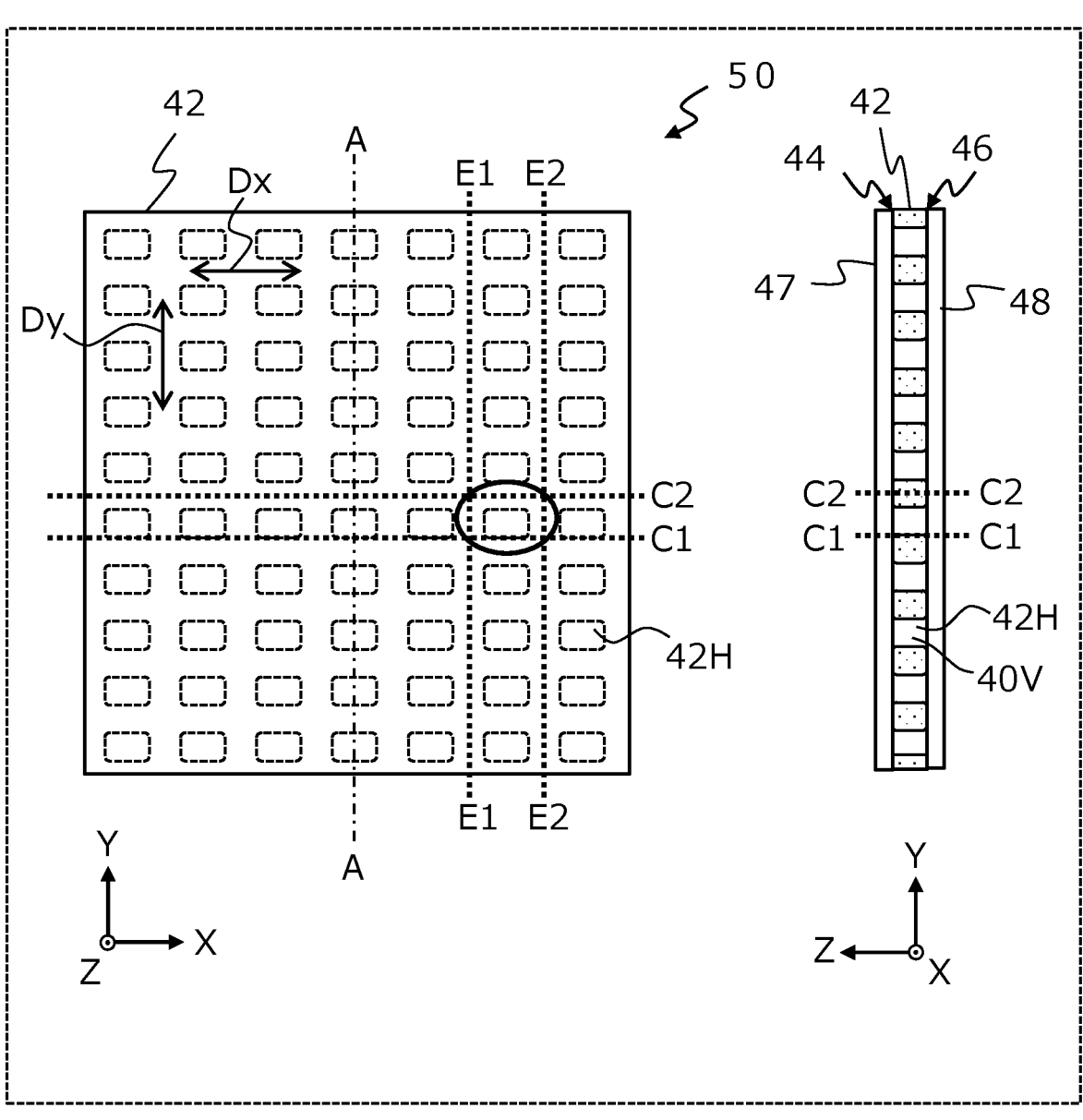
FIG. 12 is a diagram schematically showing an upper surface (on the left) of a panel that is formed by bonding together the first to third plates and a cross section along line A-A (on the right).

Subsequently, anodic bonding is performed under conditions similar to the aforementioned anodic bonding conditions to bond a second plate (thickness: e.g., 0.2 to 1.0 mm) 48 to the second surface 46 side of the third plate 42, on which the metal layer 49M is formed. Thus, as shown in FIG. 12, a panel (stacked body) 50 is obtained in which the through-holes 42H of the third plate 42 are closed by the first plate 47 and the second plate 48. After a singulation step, each through-hole 42H of the third plate 42 functions as the recess 40V of the cap 40. In the following description, before singulation, a hole that penetrates the third plate 42 will be straightforwardly referred to as a "through-hole", rather than a "recess", for convenience. In FIG. 12, for simplicity, the antireflection coatings 55a and 55b are omitted from illustration. The metal layer 49M is not needed in the case where the third plate 42 is formed of a semiconductor such as silicon, for example.

In the above example, the first plate 47 is bonded to the third plate 42, and thereafter the second plate 48 is bonded to the third plate 42; however, any discretionary order may be chosen. If the first plate 47 is bonded to the third plate 42 after the second plate 48 is bonded to the third plate 42, various processes and work for producing the panel 50 are not likely to affect the first plate 47. Because the front wall 40F to transmit laser light is formed from the first plate 47, the first plate 47 should preferably receive more careful handling than does the second plate 48. Therefore, in the case where the first plate 47 and the second plate 48 are not simultaneously bonded to the third plate 42, it is desirable to bond the first plate 47 to the third plate 42 after bonding the second plate 48 to the third plate 42. Thereafter, a singulation step is carried out, where the panel 50 is cut along the first direction Dx and along the second direction Dy to produce a plurality of caps 40 from the panel 50. In the singulation step, when cutting the panel 50 along the first direction Dx, a first incision (dotted line C1) is made along inner wall surfaces of each row of through-holes 42H adjacent along the first direction Dx, these inner wall surfaces extending along the first direction Dx and the thickness direction; when cutting the panel 50 along the second direction Dy, a second incision (dotted lines E1 and E2) is made at a position spaced from each column of through-holes 42H adjacent along the second direction Dy. More specifically, other incisions (dotted lines C2) are also made along the first direction Dx. This allows as many caps 40 as the through-holes 42H in the panel 50 to be obtained from one panel 50. Within a region encircled by an ellipse in FIG. 12, for example, a given cap 40 is to be taken out from the portion that is surrounded by the incisions. The incisions may be made by using a dicing blade, for example. Although FIG. 12 schematically illustrates the incisions with dotted lines C1, C2, E1 and E2, the actual incisions may each have a width in the range of 20 μm to 500 μm, for example. In the case of cutting with a dicing blade, the width of an incision depends on the blade thickness, and will not be smaller than the thickness of the blade. Each of dotted lines C1, C2, E1 and E2 corresponds to the center line of an incision having a predetermined width. When a cut is made by using a dicing blade, for example, the position of the center line of any incision that is made in the panel 50 may have a deviation (dimensional accuracy or dimensional tolerance) of e.g. 10 μm to 50 μm from the target line of the cut.

Figure 13:
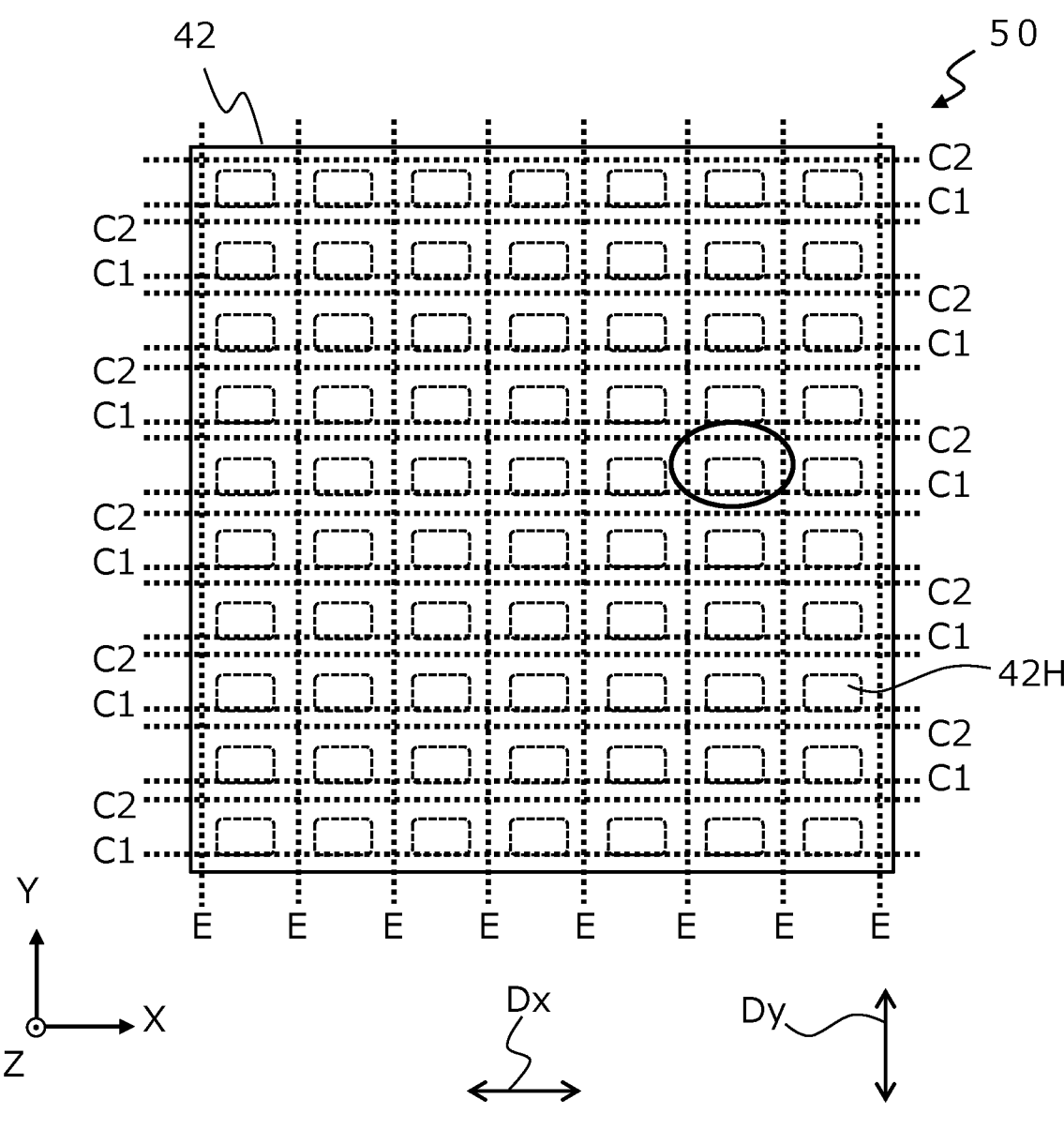
FIG. 13 is a plan view schematically showing positions of incisions that may be needed for singulation from one entire panel.

With dotted lines C1, C2 and E, FIG. 13 schematically shows incisions that may be needed for singulation from one entire panel 50. In the exemplary manner of cutting illustrated in FIG. 13, each cap 40 to be singulated is oriented in the same direction.

Figure 14:
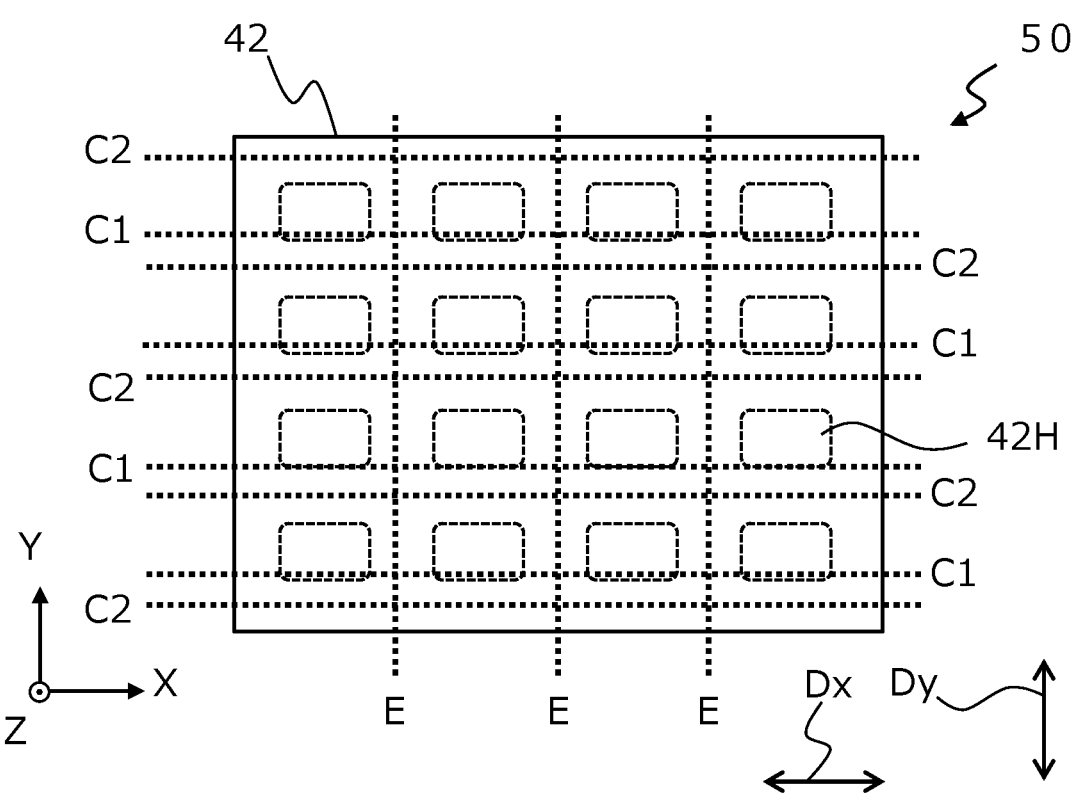
FIG. 14 is a partially enlarged plan view of FIG. 13.
Figure 15:
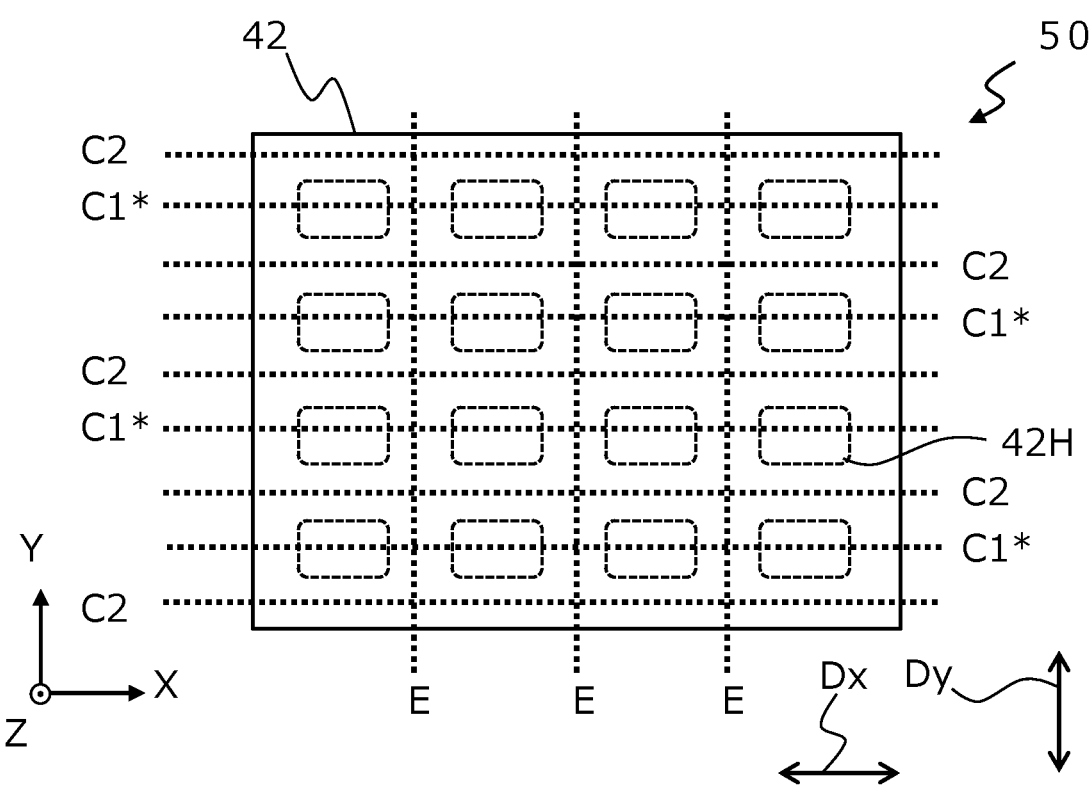
FIG. 15 is a plan view showing Comparative Example, in which first incisions are made through a row of through-holes adjacent along a first direction before singulation.

FIG. 14 is a partially enlarged view of FIG. 13. FIG. 15 shows Comparative Example, in which first incisions (dotted line C1*) are made across a row of through-holes 42H adjacent along the first direction Dx before singulation. FIG. 14 schematically depicts a state where the incisions (dotted lines C1) are at positions which are deviated from the inner wall surfaces of the through-holes 42H in the positive direction of the Y axis. FIG. 15 schematically depicts a state where the position of each incision (dotted line C1*) is deviated in the positive direction of the Y axis from a position that would bisect the through-holes 42H in upper and lower halves. As is clear from FIG. 14, in the present embodiment, if a given first incision (dotted line C1) is deviated in the positive direction of the Y axis, then the cavity in each cap whose lower end surface (bonding surface) is defined by that first incision (dotted line C1) changes its size (height) from the target value. On the other hand, in Comparative Example, each of the through-holes 42H that is cut by a first incision (dotted line C1*) is divided into the cavities of two caps. Therefore, in Comparative Example, if a given first incision (dotted line C1*) is deviated in the positive direction of the Y axis, as is clear from FIG. 15, one of the pair of cavities that are created through division at the first incision (dotted line C1*) will increase in size (height) from the target value, while the other one will decrease in size (height) from the target value. This is likely to result in a greater difference in size (height) between the pair of cavities.

Moreover, as shown in FIG. 15, the portions of the panel 50 that are to be cut by the first incisions (dotted lines C1*) are portions where the through-holes 42H are arranged periodically, which are poorer in mechanical strength than their counterparts according to the present embodiment (i.e., portions cut by the dotted lines C1, which are solid portions with a uniform thickness). As a result of this, nonuniform stresses exerted by a dicing blade, for example, may act around each through-hole 42H. Moreover, each portion between two through-holes 42H adjacent along a dotted line C1* may be regarded as a doubly supported beam extending along the Y axis direction, and the dicing blade may act upon the center of each such beam to cause deformation or chipping of the beam. This may lower the dimensional accuracy of cutting, or increase the occurrence rate of chipping at glass edges or increase the chipping size.

Comparative Example as such is to be contrasted to the present embodiment, where the first incisions (dotted lines C1) run through portions that are substantially solid portions (i.e., the base, rather than the center, of each beam-like portion between two through-holes 42H). This is less likely to cause a deterioration in the dimensional accuracy of cutting.

As has been described with reference to FIG. 11A and FIG. 11B, the antireflection coatings 55a are provided on the inner surface of the first plate 47. In the case of FIG. 15, the first incisions (dotted lines C1*) run near the center of each through-hole 42H, so that the antireflection coatings 55a may possibly be peeled. Depending on the method of thin film deposition, the antireflection coatings 55a may possibly exhibit best characteristics near the center of each patterned antireflection coating 55a. Therefore, cutting through the center of the antireflection coating 55a may cause a characteristic deterioration of the antireflection coating 55a, at the position through which laser light passes within the singulated cap 40. Thus, performing a singulation in the manner shown in FIG. 14, i.e., the first incisions being located at the dotted lines C1, contributes to make the antireflection coatings 55a performance more suitable.

As can be seen from FIG. 14, when a cut is made along a dotted line C1 by using a dicing blade, such that the first incision is made along the inner wall surfaces of the through-holes 42H, one face of the dicing blade is oriented toward the centers of the through-holes 42H, whereas the other face of the dicing blade is, ideally, always in contact with solid portions of the panel 50 so as to contribute to processing. For example, abrasive grains of diamond are adhered to both faces of the dicing blade. If only one face of the dicing blade is at work on the solid portions of the panel 50, a so-called "one-side wear" (i.e., the abrasive grains on only one face of the blade becoming worn out first) may occur, thereby reducing the life of the dicing blade.

Figure 16A:
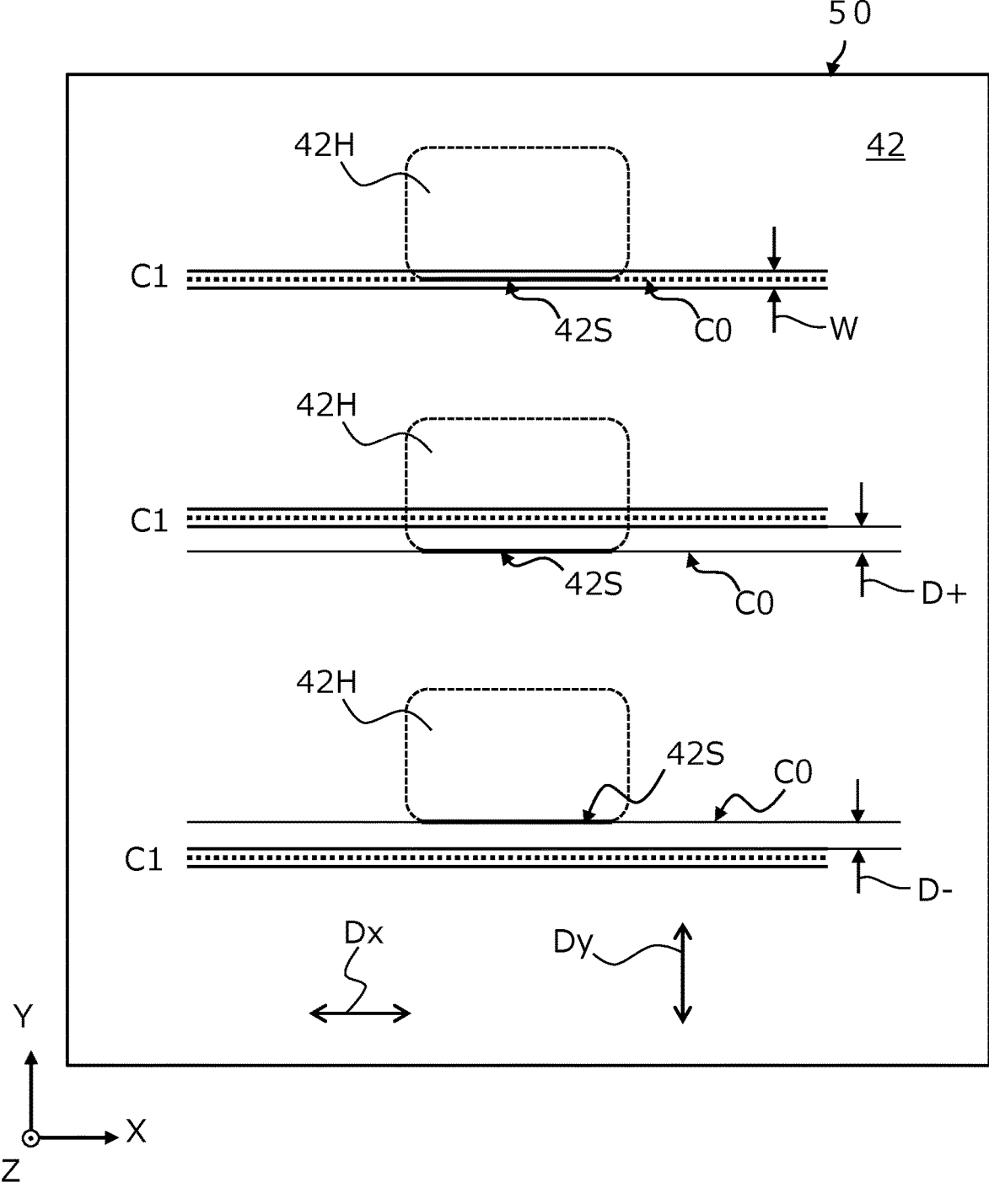
FIG. 16A is a plan view showing relationships between an incision having a predetermined width and a target line for a cut.

FIG. 16A is a plan view showing schematically, but with exaggeration, the following examples within the present embodiment: an example where a first incision having a width W is not shifted from a target line C0 for cutting; an example where the first incision is shifted by a distance D+ in a direction toward the center of a through-hole 42H from the target line C0; and an example where the first incision is shifted by a distance D− in a direction away from the center of the through-hole 42H from the target line C0.

Figure 16B:
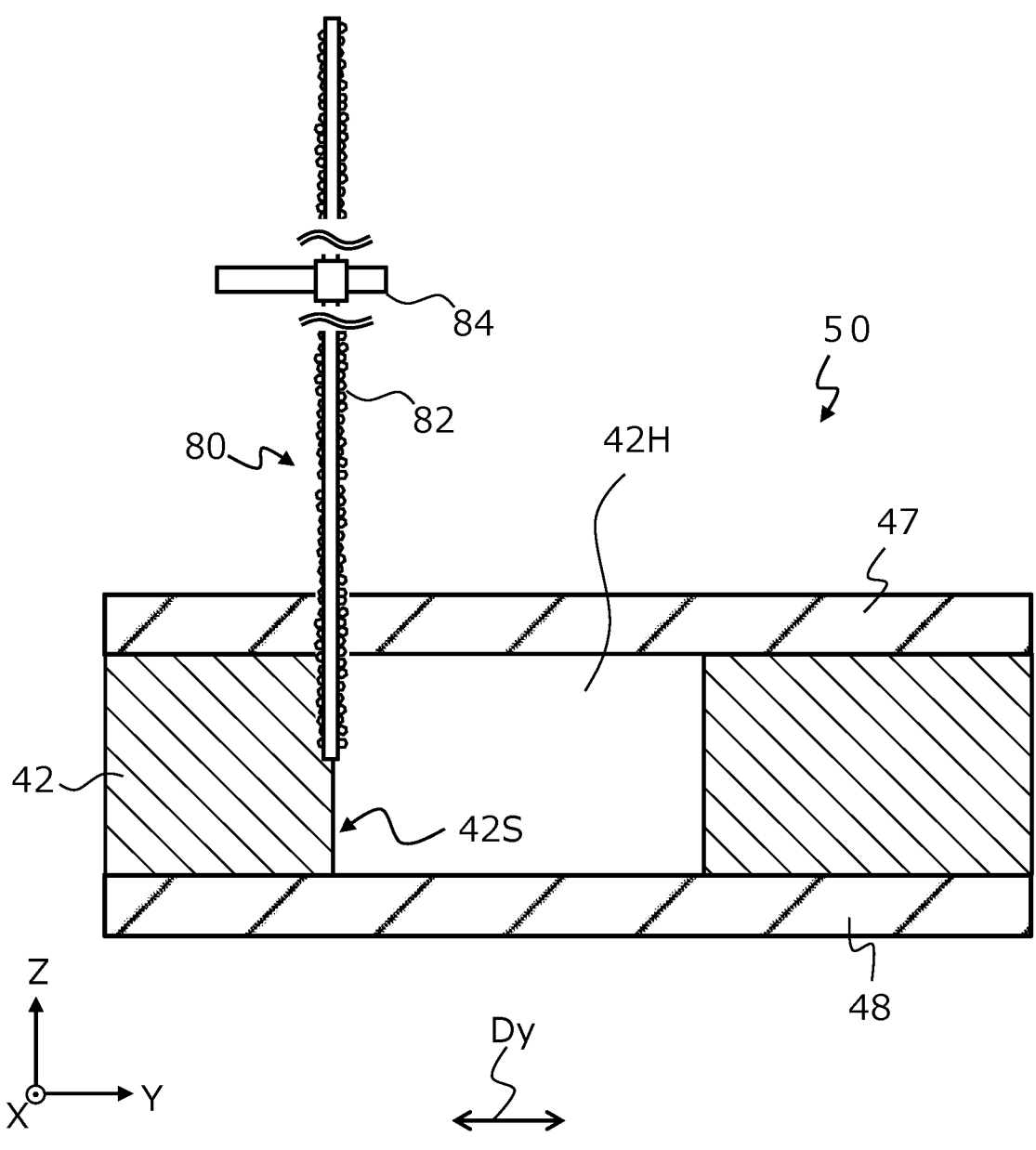
FIG. 16B is a cross-sectional view schematically showing a cut by a dicing blade in progress, where a first incision is at a position including the inner wall surface of a through-hole.

FIG. 16B is a cross-sectional view schematically showing a cut by a dicing blade 80 in progress, where a first incision is at a position including the inner wall surface 42S of a through-hole 42H. A multitude of abrasive grains 82 are adhered to both faces of the dicing blade 80. The dicing blade 80 is able to rapidly rotate around a rotation axis 84, thereby cutting the panel 50. FIG. 16B shows a state where the cut has progressed into a position about half of the thickness of the third plate 42. In the present embodiment, each through-hole 42H has an inner wall surface, which includes four planes angled at 90 degrees from one another; the first incision is made along one of these four planes of the inner wall surface 42S.

See FIG. 16A again. In the singulation step, the position of the first incision is desirably determined so that the position of the inner wall surface 42S (as defined by the aforementioned one of the four planes thereof) of each through-hole 42H will be included in the first incision (width W). Given that the width W of the first incision is e.g. 200 μm, so long as the target line C0 coincides with the inner wall surface 42S of the through-hole 42H, the position of the inner wall surface 42S of the through-hole 42H will be included in the first incision (width W) even if the first incision is shifted by e.g. 50 μm or less along the second direction (Dy direction). However, if the target line C0 is deviated by more than a half of the width W from the position of the inner wall surface 42S, the position of the inner wall surface 42S of the through-hole 42H may not be included in the first incision (width W). The position of the first incision may possibly be shifted toward one or the other end of the second direction (Dy direction), i.e., in the positive direction or the negative direction of the Y axis. As shown in FIG. 16A and FIG. 16B, when the position of the first incision is shifted from the inner wall surface 42S of the through-hole 42H in the negative direction of the Y axis, such that the position of the inner wall surface 42S is no longer included in the first incision, the through-hole 42H will no longer serve as a cavity of the cap 40, which means a manufacturing failure. When the position of the first incision is shifted from the inner wall surface 42S of the through-hole 42H in the positive direction of the Y axis, however, the through-hole 42H can still function as a cavity of the cap 40 even if the position of the inner wall surface 42S is not included in the first incision.

In view of the above, in the singulation step according to the present disclosure, to "make a first incision along the inner wall surface 42S of a through-hole" is defined as making a cut so that the aforementioned distance D+ is 0 µm or more and that the distance D+ is 25% or less of the size of the through-hole along the second direction (Dy direction). When such a cut is made, one recess 40V of a cap 40 is created from each through-hole 42H. If the distance D+ exceeds 0 µm, two recesses 40V may be created from one through-hole 42H; however, a large size difference (asymmetry) will exist between two such recesses 40V if a "cut" is performed as defined above, such that one of the recesses 40V is not suitable for accommodating a laser diode.

Note that increasing the distance D+ from 0 µm can suppress one face of the dicing blade from always working on solid portions of the panel 50 (i.e., suppression of one-side wear). Moreover, in a plan view, curved portions (rounded corners) may exist at the four corners of each through-hole 42H. A sum total of the width W of the first incision and the distance D+ may be set equal to or greater than the radius of curvature of each such rounded corner, for example.

In the singulation step above, as mentioned earlier, it is preferable for the plurality of antireflection coatings 55a to be not cut, either when the panel (stacked body) 50 is cut along the first direction (Dx direction) or when the panel 50 is cut along the second direction (Dy direction). The reason is that, if the dicing blade cuts through the antireflection coatings 55a, some of the antireflection coatings 55a may suffer from peeling.

Without using a dicing blade, the incisions may be made by other methods of cutting, such as laser cutting.

The above-described singulation step produces caps 40 such that the shortest distance between the perimeter of the antireflection coating 55a and the lower end surface 40E of the front wall 40F is within a range of 10 µm to 100 µm, for example. By forming a pattern of antireflection coatings 55a with the aforementioned method, the perimeter of each antireflection coating 55a is kept spaced from the boundary between the main body 40B and the recess 40V, in a plan view as seen from the normal direction of the front wall 40F.

Figure 16C:
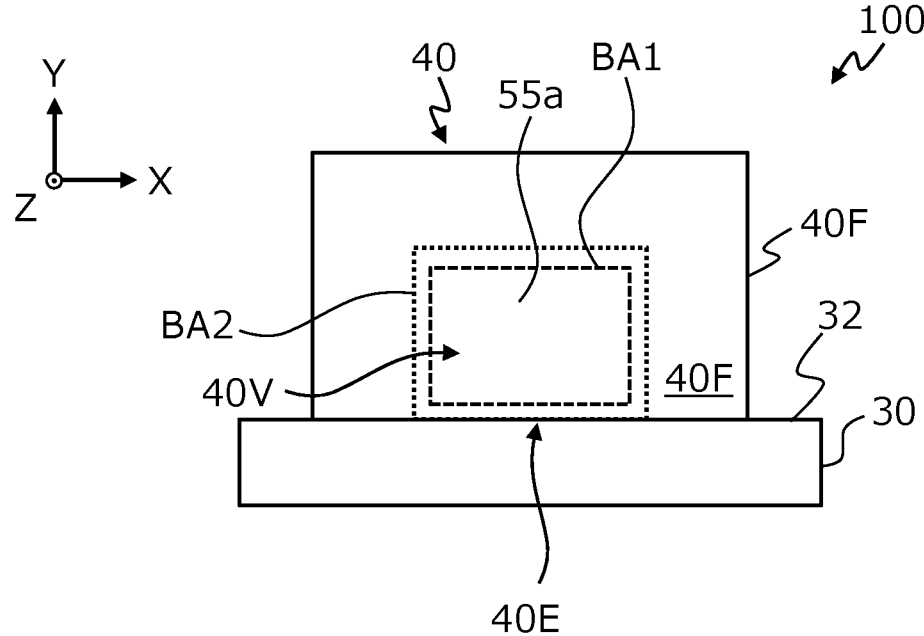
FIG. 16C is a front view of the light source device according to the present embodiment as seen from the normal direction of a front wall of the cap.

FIG. 16C is a front view of the light source device 100 according to the present embodiment as seen from the normal direction of the front wall of the cap 40. As shown in FIG. 16C, the perimeter BA1 (broken line) of the anti-reflection coating 55a is spaced from the boundary BA2 (dotted line) between the main body 40B and the recess 40V.

Modified Examples of Singulation Method

Hereinafter, a modified example of the singulation method will be described which, in implementations where a dicing blade is used, allows for suppressing one-side wear of the dicing blade.

Figure 17A:
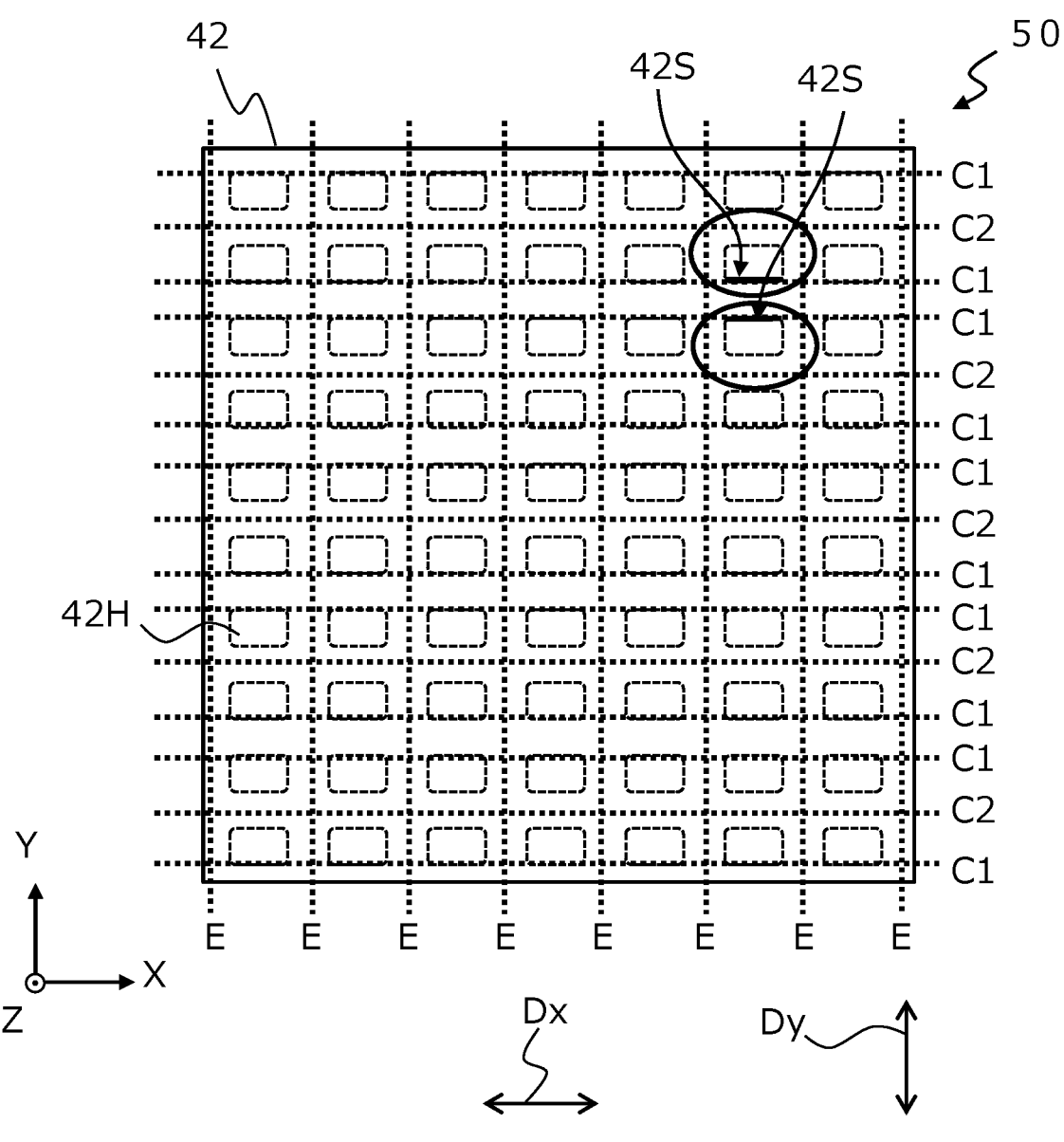
FIG. 17A is a plan view schematically showing a first modified example of a singulation method.

FIG. 17A is a plan view schematically showing a first modified example of the singulation method. This represents a plan view as seen from the normal direction of the surface of the third plate 42. Similarly to the above embodiment, in this modified example, the plurality of through-holes 42H are arranged in a plurality of rows that run parallel to the first direction (Dx direction) and a plurality of columns that run parallel to the second direction (Dy direction). In this exemplary singulation step, the positions of the first incisions are determined so that: when making first incisions along the inner wall surfaces 42S of those through-holes 42H which are included in odd-numbered rows among the plurality of rows, one face of the dicing blade faces toward the centers of the through-holes 42H; and, when making first incisions along the inner wall surfaces 42S of those through-holes 42H which are included in even-numbered rows, the other face of the dicing blade faces toward the centers of the through-holes 42H. For reference, in FIG. 17A, two caps 40 to be oriented in opposite directions when singulated are indicated by ellipses around them. These two caps will have lower end surface which are created by first incisions in opposing positions.

By such a singulation method, both faces of the dicing blade may contribute to substantially an equal degree of processing. This can suppress one-side wear of the dicing blade.

Figure 17B:
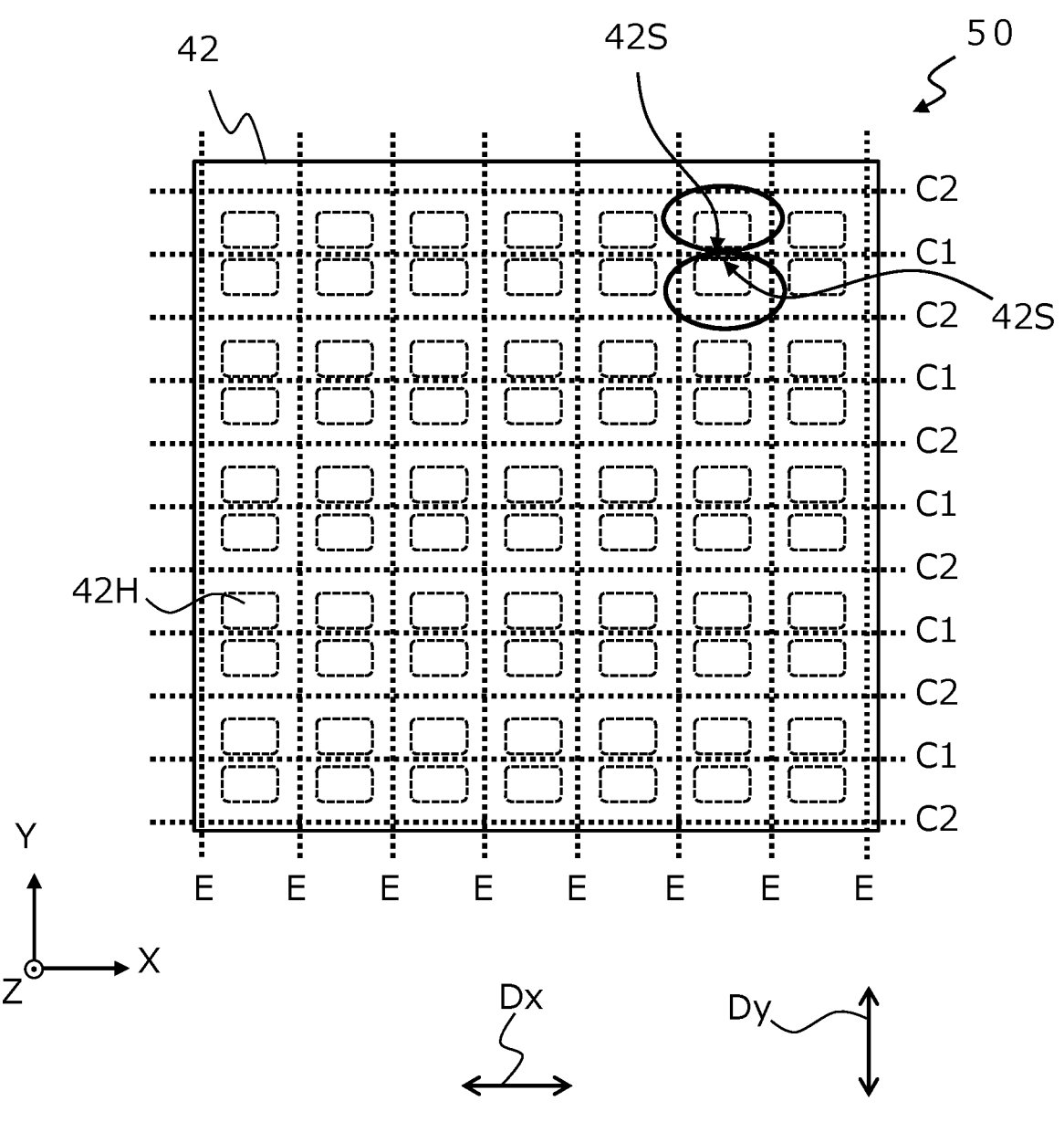
FIG. 17B is a plan view schematically showing another modified example of the singulation method.

Next, with reference to FIG. 17B, another modified example of the singulation method will be described.

In this modified example, too, the plurality of through-holes 42H are arranged in a plurality of rows that run parallel to the first direction (Dx direction) and a plurality of columns that run parallel to the second direction (Dy direction). In this exemplary singulation step, each first incision is made along both of the inner wall surfaces 42S of those through-holes 42H which are included in odd-numbered rows among the plurality of rows and the inner wall surfaces 42S of those through-holes 42H which are included in the even-numbered rows that are adjacent to this odd-numbered rows. Each of the first incisions is made so as to include the opposing inner wall surfaces 42S of the through-holes 42H which are included in an adjacent pair of an odd-numbered row and an even-numbered row. In other words, the inter-space between through-holes 42H included in an adjacent pair of odd-numbered and even-numbered rows is smaller than the width W of a first incision (see FIG. 16A). According to this modified example, the singulation step can be carried out by utilizing both faces of a dicing blade having a relatively large width W. Next, with reference to FIG. 18, still another modified example of the singulation method will be described.

Figure 18:
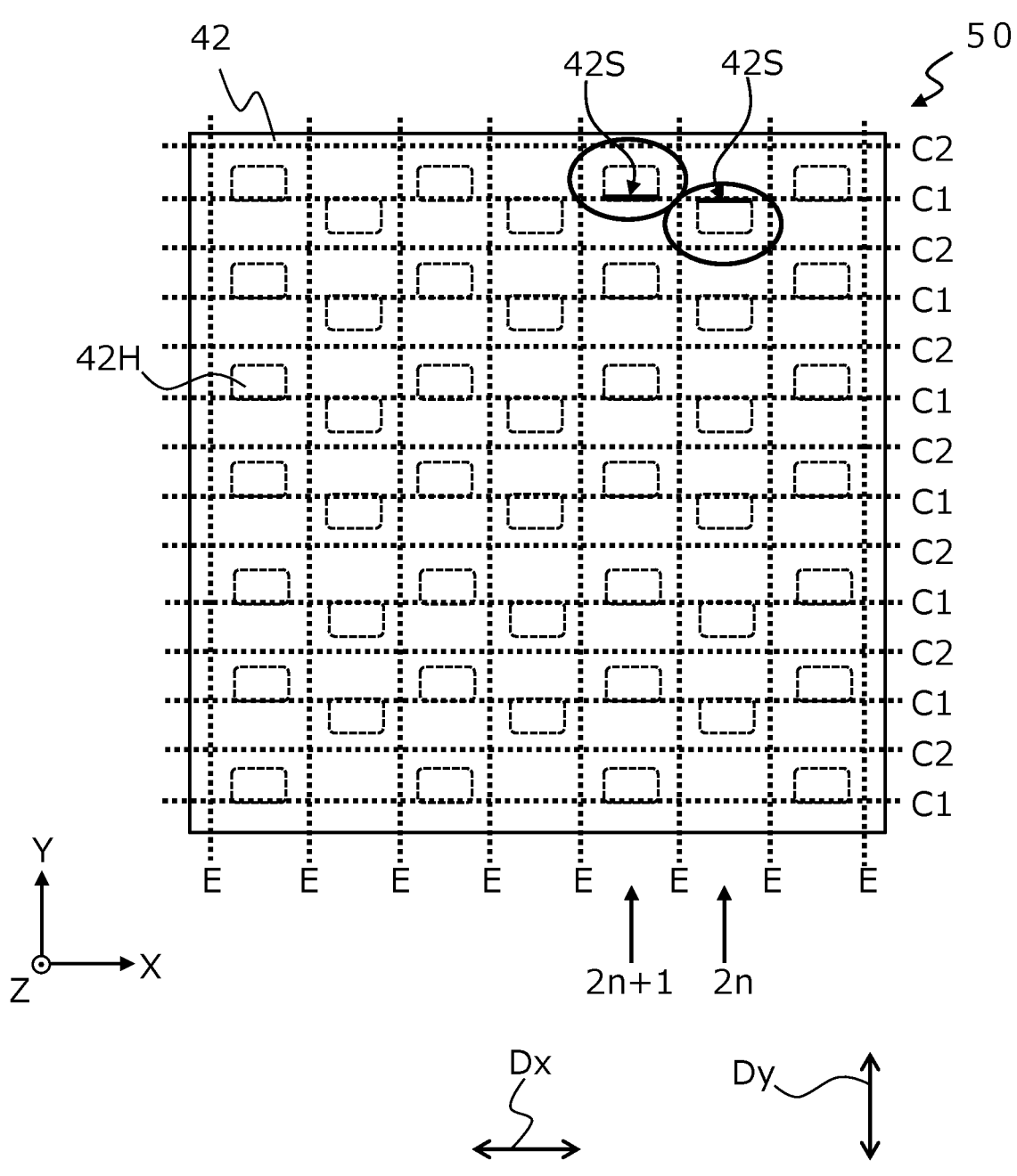
FIG. 18 is a plan view schematically showing still another modified example of the singulation method.

In the example of FIG. 18, in a plan view as seen from the normal direction of the surface of the third plate 42, a plurality of through-holes 42H constitute a plurality of rows each of which is in a zigzag arrangement along the first direction (Dx direction). The amplitude (half amplitude of oscillation) of the zigzag arrangement at the center positions of the through-holes 42H is about a half the size of the through-holes 42H along the second direction (Dy direction). With this zigzag arrangement, the inner wall surfaces 42S of the through-holes 42H included in odd-numbered columns (2n+1) and the inner wall surfaces 42S of the through-holes 42H included in even-numbered columns (2n) alternate in substantially linear fashion (where "n" is an integer equal to or greater than 0). Stated otherwise, the plurality of through-holes 42H are provided at positions that allow each first incision (dotted line C1) in the singulation step to include both the inner wall surfaces 42S of the through-holes 42H which are included in odd-numbered columns (2n+1) among the plurality of columns and the inner wall surfaces 42S of the through-holes 42H which are included in even-numbered columns (2n) among the plurality of columns. For reference's sake, in FIG. 18, two caps to be singulated from one row in the zigzag arrangement are each encircled by an ellipse. These two caps will have their lower end surfaces defined by a common first incision (dotted line C1).

In this exemplary singulation step, when the dicing blade creates a first incision, the position of the first incision (dotted line C1) can be determined so that one face of the dicing blade faces toward the centers of the through-holes 42H included in odd-numbered columns and that the other face of the dicing blade faces toward the centers of the through-holes 42H included in even-numbered columns. In other words, with respect to each first incision (dotted line C1), the through-holes 42H included in odd-numbered columns (2n+1) and the through-holes 42H included in even-numbered columns (2n) are located at alternately opposite positions. Each first incision (dotted line C1) passes through the center of each row of through-holes 42H which are in a zigzag arrangement along the first direction (Dx direction), and passes through the inner wall surfaces 42S of the through-holes 42H included in odd-numbered columns (2n+1) and even-numbered columns (2n) in that row.

By such a singulation method, both faces of the dicing blade will make substantially an equal degree of contribution to the processing. This can suppress one-side wear of the dicing blade. In the example of FIG. 18, the upper surface of each cap to be singulated is formed by another incision (dotted line C2) that is parallel to the first incision (dotted line C1).

Next, with reference to FIG. 19, still another modified example of the singulation method will be described.

Figure 19:
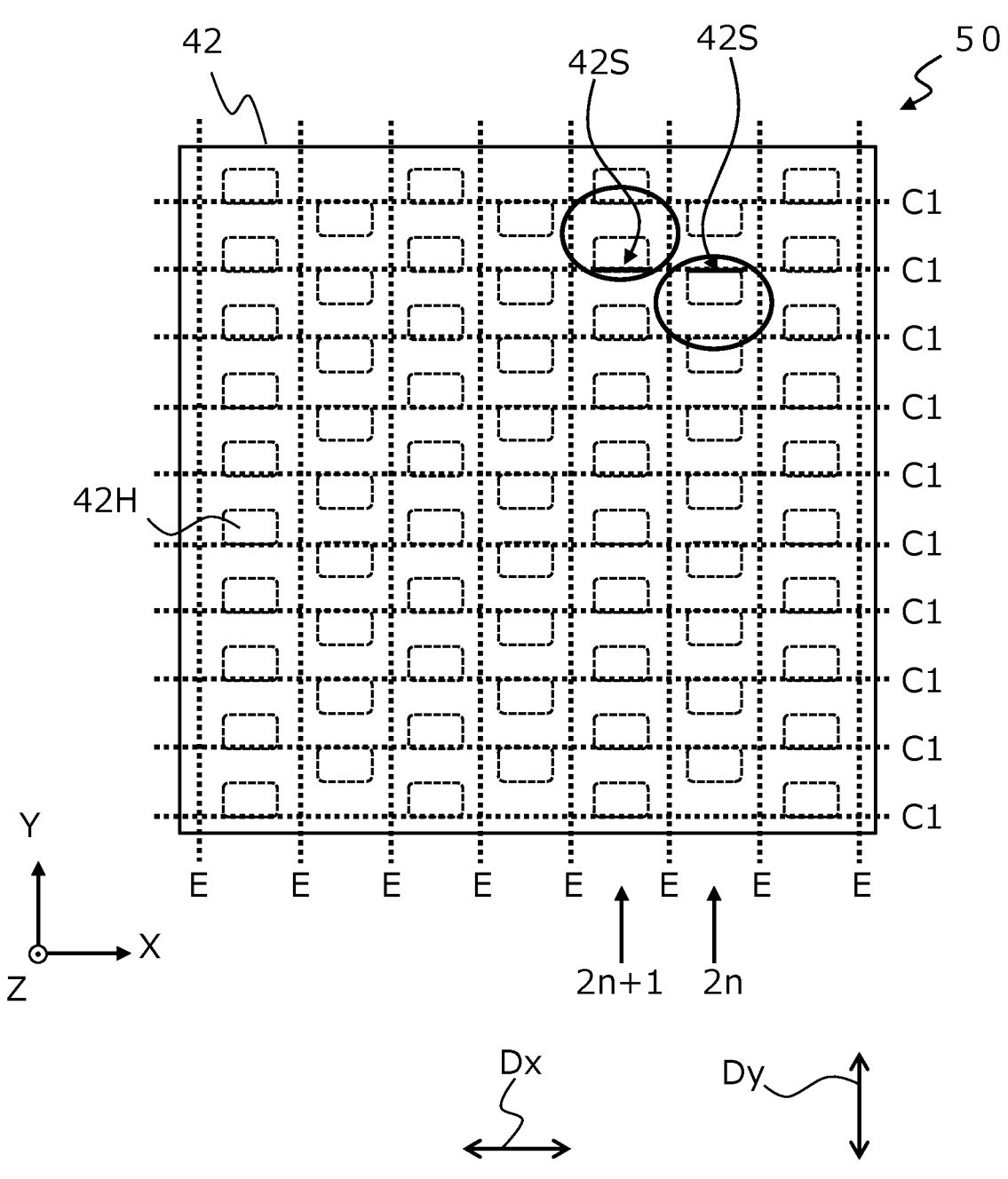
FIG. 19 is a plan view schematically showing still another modified example of the singulation method.

In the example of FIG. 19, cuts along the dotted lines C2 in FIG. 18 are not made. In other words, singulation of the caps is achieved by first incisions along the dotted lines C1 and second incisions along the dotted lines E. For reference's sake, in FIG. 19, two caps to be singulated from one row in the zigzag arrangement are each encircled by an ellipse. These two caps will have their lower end surfaces defined by a common first incision (dotted line C1). Similarly to the example of FIG. 18, in this example, with respect to each first incision (dotted line C1), the through-holes 42H included in odd-numbered columns (2n+1) and the through-holes 42H included in even-numbered columns (2n) are located at alternately opposite positions. Each first incision (dotted line C1) passes through the center of each row of through-holes 42H which are in a zigzag arrangement along the first direction (Dx direction), and passes through the inner wall surfaces 42S of the through-holes 42H included in odd-numbered columns (2n+1) and even-numbered columns (2n) in that row.

The lower end surface of each cap 40 that has been thus singulated is defined by a first incision (dotted line C1). The lateral surface of each cap 40 is defined by a second incision (dotted line E). The upper surface of each cap 40 is defined by another first incision (dotted line C1). The surface of each cap 40 may have irregularities that result from dicing or other processing in the singulation step. On the other hand, laser light will be transmitted through the smooth portion of the first plate 47, and therefore is free from adverse effects of the processing irregularities. Thus, according to the present embodiment, flatness and smoothness of the first plate 47 are not degraded through the manufacturing, so that laser light is transmitted through a portion of the cap 40 that has good smoothness. Because the surface that appears through the formation of the first incisions (dotted line C1) is the lower end surface of each cap 40, which is the surface to be bonded to a substrate, it may be subjected to flatting by polishing or the like as necessary.

In this manner, a multitude of caps 40 each having a configuration shown in FIG. 4A and FIG. 4B can be produced. The front wall 40F and the rear wall 40R of each cap 40 are respectively formed of, a portion of the first plate 47 and a portion of the second plate 48, while the main body 40B is formed of a portion of the third plate 42. Moreover, each of the electrically conductive layers 40M is formed of a corresponding portion of the metal layer 49M. Using the cap 40 thus produced, the light source device 100 shown in FIG. 1A can be obtained.

According to the present embodiment, it is possible to mass-produce caps 40 having a height (size along the Y direction) of e.g., 2 millimeters or less. Moreover, an anti-reflection coating can be appropriately formed on the cap 40, so that transmittance of laser light can be enhanced, and stray light can be reduced.

Modified Examples of Cap

Hereinafter, further modified examples of the above embodiment will be described.

While the above embodiment illustrates a configuration in which at least one of the front wall 40F and the main body 40B is an alkaline glass, it is not necessary for the entire front wall 40F or the entire main body 40B to be an alkaline glass. More specifically, at least one of the front wall 40F and the main body 40B may include an alkaline glass region, and the front wall 40F and the main body 40B may be bonded together via an electrically conductive layer 40M that is in contact with that alkaline glass region included in the at least one of the front wall 40F and the main body 40B.

The cap 40 may have a configuration that includes the rear wall 40R facing the front wall 40F such that the laser diode 10 is disposed between the rear wall 40R and the front wall 40F, and the main body 40B connects the front wall 40F and the rear wall 40R together. In this case, at least one of the main body 40B and the rear wall 40R may include an alkaline glass region, and the main body 40B and the rear wall 40R may be bonded together via another electrically conductive layer 40M that is in contact with that alkaline glass region.

Figure 20:
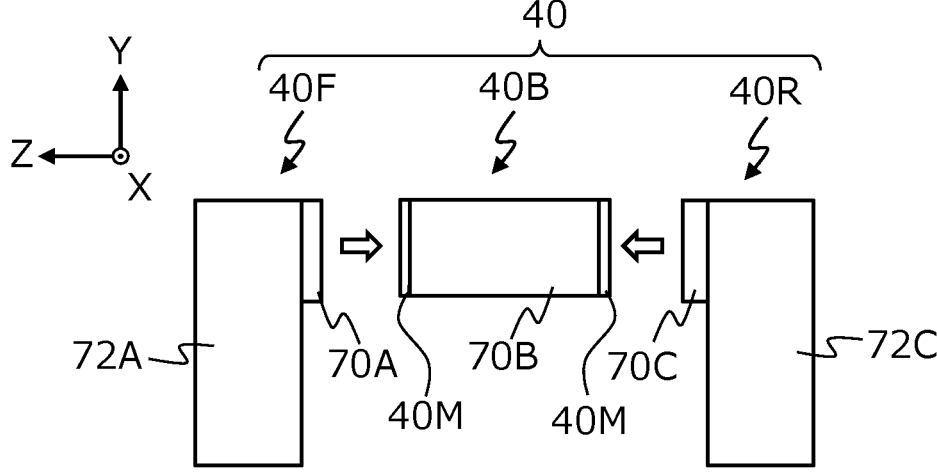
FIG. 20 is a cross-sectional view schematically showing an example configuration of a cap according to a modified example of the present embodiment.
Figure 21:
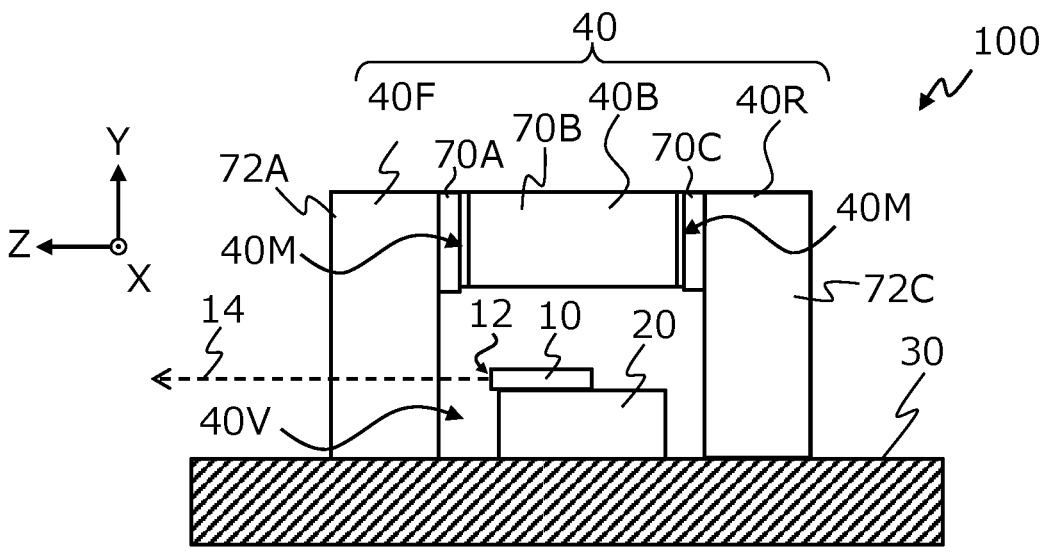
FIG. 21 is a cross-sectional view of a light source device including the cap in FIG. 20.

With reference to FIG. 20 and FIG. 21, a modified example of the present embodiment will be described. FIG. 20 is a cross-sectional view schematically showing an example structure of the cap 40 according to the modified example. FIG. 21 is a cross-sectional view of a light source device 100 including the cap 40 according to the modified example. The cap 40 shown in FIG. 20 includes a front wall 40F, a main body 40B, and a rear wall 40R. The front wall 40F includes an alkaline glass region 70A and a non-alkaline glass region 72A that is connected to the alkaline glass region 70A. The rear wall 40R includes an alkaline glass region 70C and a non-alkaline glass region 72C that is connected to the alkaline glass region 70C. The alkaline glass region 70A and the alkaline glass region 70C may each be produced through a film formation process. The main body 40B in this example includes a non-alkaline glass region 70B, but does not include an alkaline glass region. Alternatively, the main body 40B may include an alkaline glass region that is in contact with an electrically conductive layer 40M.

In the example of FIG. 20, the non-alkaline glass region 72A and the non-alkaline glass region 72C both have a thin plate shape. The alkaline glass region 70A and the alkaline glass region 70C are respectively disposed at predetermined positions of the non-alkaline glass region 72A and the non-alkaline glass region 72C. A blank arrow on the left side of FIG. 20 schematically indicates that the alkaline glass region 70A of the front wall 40F is bonded to an electrically conductive layer 40M of the main body 40B. Similarly, a blank arrow on the right side of FIG. 20 schematically indicates that the alkaline glass region 70C of the rear wall 40R is bonded to another electrically conductive layer 40M of the main body 40B. Such bonding is performed by the anodic bonding described above. In order to produce the cap 40 having such a structure, the alkaline glass region 70A may be provided in a region of the first plate 47 in FIG. 12 facing the first surface 44 of the third plate 42. Similarly, the alkaline glass region 70C may be disposed in a region of the second plate 48 in FIG. 12 facing the second surface 46 of the third plate 42. As can be seen from the left-hand side diagram in FIG. 12, the first surface 44 and the second surface 46 of the third plate 42 have a lattice shape extending across the YX plane. Accordingly, it is desirable that the alkaline glass regions 70A and 70C also have a lattice shape extending across the XY plane on the first and second plates 47 and 48.

In order to produce the cap 40 by anodic bonding, it is sufficient that an alkaline glass region exists in a portion in contact with a metal layer used for anodic bonding, and it is not necessary that the entire glass portion located on either side of the metal layer used for anodic bonding is formed of an alkaline glass.

A cap according to certain embodiments of the present disclosure has good smoothness in a light-transmitting portion thereof, and is suitable for its size reduction, thus being broadly applicable as a package part for a laser diode. A light source device according to certain embodiments of the present disclosure includes a cap having good smoothness in a light-transmitting portion thereof and being suitable for its size reduction, and therefore may be used as a small-sized light source for a head-mounted display or the like.

What is claimed is:

1. A method of manufacturing a cap having a recess configured to accommodate a laser diode, the method comprising:

providing a first plate for forming a front wall that defines a front side of the recess, at least a portion of the front wall being formed of a material that transmits laser light to be emitted from the laser diode;

providing a second plate for forming a rear wall that defines a rear side of the recess, the rear wall being opposed to the front wall;

providing a third plate for forming a main body that defines an upper side and lateral sides of the recess and is connected to the front wall and the rear wall, wherein:

the third plate has a plurality of through-holes that are arranged in a two-dimensional array along a first direction and along a second direction, the first direction extending in a plane that is orthogonal to a thickness direction of the third plate, and the second direction extending in the plane and orthogonal to the first direction;

bonding the first plate and the third plate together, and bonding the second plate and the third plate together, to produce a stacked body in which the third plate is interposed between the first plate and the second plate; and singulating the stacked body, which comprises cutting the stacked body along the first direction and along the second direction to produce a plurality of caps from the stacked body, wherein:

when the stacked body is cut along the first direction, a first incision is made along inner wall surfaces defining through-holes adjacent along the first direction, the inner wall surfaces extending along the first direction and the thickness direction, and when the stacked body is cut along the second direction, a second incision is made at a position spaced from through-holes adjacent along the second direction.

2. The method of manufacturing a cap of claim 1, wherein, in the step of singulating the stacked body, a position of the first incision is determined so that positions of the inner wall surfaces are included in the first incision.

3. The method of manufacturing a cap of claim 1, wherein:

the first plate and the second plate are each formed of a glass; and in the step of producing the stacked body, the first plate and the third plate are bonded together by anodic bonding, and the second plate and the third plate are bonded together by anodic bonding.

4. The method of manufacturing a cap of claim 1, wherein:

the step of providing the first plate comprises forming, on a surface of the first plate, a plurality of antireflection coatings at positions respectively facing the plurality of through-holes in the third plate.

5. The method of manufacturing a cap of claim 4, wherein, in the step of singulating the stacked body, the plurality of antireflection coatings are neither cut when the stacked body is cut along the first direction nor cut when the stacked body is cut along the second direction.

6. The method of manufacturing a cap of claim 1, wherein:

in a plan view as seen from a normal direction of a surface of the third plate, the plurality of through-holes are arranged in a plurality of rows parallel to the first direction and a plurality of columns parallel to the second direction;

in the step of singulating the stacked body, the first incision is made by using a dicing blade; and a position of the first incision is such that:

when making the first incision along the inner wall surfaces defining the through-holes that are included in an odd-numbered row among the plurality of rows, a first face of the dicing blade faces toward centers of the through-holes; and when making the first incision along the inner wall surfaces defining the through-holes that are included in an even-numbered row among the plurality of rows, a second face of the dicing blade faces toward centers of the through-holes.

7. The method of manufacturing a cap of claim 6, wherein, in the step of singulating the stacked body, the first incision is made so as to include the opposing inner wall surfaces defining those through-holes that are included in an adjacent pair of an odd-numbered row and an even-numbered row among the plurality of rows.

8. The method of manufacturing a cap of claim 1, wherein:

in a plan view as seen from a normal direction of a surface of the third plate, the plurality of through-holes constitute a plurality of rows each of which is in a zigzag arrangement along the first direction; and the plurality of through-holes are provided at positions in which the first incision made in the step of singulating the stacked body includes both the inner wall surfaces of the through-holes that are included in odd-numbered columns among the plurality of columns and the inner wall surfaces of the through-holes that are included in even-numbered columns among the plurality of columns.

9. The method of manufacturing a cap of claim 8, wherein:

in the step of singulating the stacked body, the first incision is made by using a dicing blade; and when the dicing blade makes the first incision, the position of the first incision is such that a first face of the dicing blade faces toward centers of the through-holes included in the odd-numbered columns, and a second face of the dicing blade faces toward centers of the through-holes included in the even-numbered columns.

\*　　\*　　\*　　\*　　\*